(12) United States Patent
Fushie et al.

(10) Patent No.: US 7,470,865 B2
(45) Date of Patent: *Dec. 30, 2008

(54) MULTILAYER PRINTED WIRING BOARD AND A PROCESS OF PRODUCING SAME

(75) Inventors: Takashi Fushie, Tokyo (JP); Takeshi Kagatsume, Hachioji (JP); Shigekazu Matsui, Nirasaki (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/429,103

(22) Filed: May 8, 2006

(65) Prior Publication Data

US 2006/0191710 A1    Aug. 31, 2006

Related U.S. Application Data

(62) Division of application No. 11/209,790, filed on Aug. 24, 2005, now abandoned, which is a division of application No. 10/003,103, filed on Dec. 6, 2001, now abandoned, which is a division of application No. 09/579,270, filed on May 26, 2000, now Pat. No. 6,339,197.

(30) Foreign Application Priority Data

May 27, 1999   (JP)   ................................. 11-147811
May 22, 2000   (JP)   ............................ 2000-149570

(51) Int. Cl.
 *H01R 12/04* (2006.01)
 *H05K 1/11* (2006.01)
(52) U.S. Cl. ....................................... 174/262; 174/256
(58) Field of Classification Search ................. 174/262, 174/261, 264, 266
See application file for complete search history.

(56) References Cited

U.S. PATENT DOCUMENTS 4,096,626 A    6/1978   Olsen et al.

(Continued)

FOREIGN PATENT DOCUMENTS

JP    06227843    8/1994

(Continued)

OTHER PUBLICATIONS

IBM Technical Disclosure Bulletin No. NA83081094.

*Primary Examiner*—Ishwar (I. B.) Patel
(74) *Attorney, Agent, or Firm*—Westerman, Hattori, Daniels & Adrian, LLP.

(57) ABSTRACT

A multilayer printed wiring board which permits the formation of fine wiring patterns, thereby increasing the density of wiring patterns. Using photosensitive glass having a coefficient of thermal expansion close to that of a copper film as a core substrate, a through hole is formed in the photosensitive glass by photolithography, a sputtering silicon oxide layer and a sputtering silicon nitride layer are formed to prevent leak of alkali metal ions from the photosensitive glass, a sputtering chromium layer, a sputtering chromium-copper layer and a sputtering copper layer are formed to enhance the adhesion strength between the copper film and the sputtering silicon oxide layer, and a copper film of 1 to 20 μm thick is formed. With resin filled into the interior of the through hole, a wiring layer is patterned by etching, an insulating layer is formed, and the surface is covered with a surface treatment layer and a cover coat.

10 Claims, 14 Drawing Sheets

U.S. PATENT DOCUMENTS

| | | | | |
|---|---|---|---|---|
| 4,435,718 A | | 3/1984 | Clark et al. | |
| 4,464,704 A | | 8/1984 | Huie et al. | |
| 4,574,255 A | | 3/1986 | Fujii et al. | |
| 4,665,468 A | | 5/1987 | Dohya | |
| 4,837,408 A | * | 6/1989 | Kondo et al. | 174/257 |
| 5,057,959 A | * | 10/1991 | Inoue et al. | 360/126 |
| 5,122,930 A | * | 6/1992 | Kondo et al. | 361/793 |
| 5,173,836 A | * | 12/1992 | Tomase et al. | 361/283.1 |
| 5,243,142 A | | 9/1993 | Ishikawa et al. | |
| 5,266,446 A | | 11/1993 | Change et al. | |
| 5,468,672 A | | 11/1995 | Rosvold | |
| 5,488,542 A | | 1/1996 | Ito | |
| 5,685,070 A | | 11/1997 | Alpaugh et al. | |
| 5,738,977 A | * | 4/1998 | Van Der Sluis-Van Der Voort et al. | 430/313 |
| 5,840,201 A | | 11/1998 | Elledge | |
| 5,936,843 A | | 8/1999 | Ohshima et al. | |
| 6,066,889 A | * | 5/2000 | Jones et al. | 257/698 |
| 6,162,365 A | * | 12/2000 | Bhatt et al. | 216/13 |
| 6,181,551 B1 | | 1/2001 | Herman et al. | |
| 6,339,197 B1 | | 1/2002 | Fushie et al. | |
| 6,586,829 B1 | * | 7/2003 | Yaniv et al. | 257/693 |
| 6,605,497 B2 | * | 8/2003 | Yamazaki et al. | 438/166 |
| 6,777,965 B1 | * | 8/2004 | Mess | 324/755 |

FOREIGN PATENT DOCUMENTS

| | | |
|---|---|---|
| JP | 10093222 | 4/1998 |
| JP | 411012787 A | 1/1999 |
| JP | 11087873 | 3/1999 |

* cited by examiner

32a EXPOSURE-CRYSTALLIZED PORTION

32 PHOTOSENSITIVE GLASS

33 THROUGH HOLE

32

33

32

COPPER FILM 36

SPUTTERING COPPER LAYER 35c

SPUTTERING CHROMIUM-COPPER LAYER 35b

SPUTTERING CHROMIUM LAYER 35a

33

32

50 COMB PATTERN

MULTILAYER PRINTED WIRING BOARD AND A PROCESS OF PRODUCING SAME

This application is a divisional of application Ser. No. 11/209,790 filed Aug. 24, 2005, now abandoned which is a divisional of application Ser. No. 10/003,103 filed on Dec. 6, 2001, which has been abandoned, which is a divisional application of Ser. No. 09/579,270, filed May 26, 2000, issued as U.S. Pat. No. 6,339,197 on Jan. 15, 2002.

BACKGROUND OF THE INVENTION (1) Field of the Invention

The present invention relates to a multilayer printed wiring board having a multilayer wiring pattern and a process of producing same, and more particularly, to a multilayer printed wiring board which permits the formation of high-density wiring patterns and a production process therefor.

(2) Description of the Related Art

In recent years, MCM (Multi Chip Module) having a plurality of bare-chip LSIs mounted at high density on a multilayer wiring board has come to be widely used. MCM is used in various types of OA equipment, mobile communication equipment, industrial equipment, etc., such as in notebook computers and mobile phones, and has been greatly contributing to the reduction in size and weight of such equipment In the field of notebook computers, mobile phones and the like, further reduction of their size and weight is expected in future as well, and thus there will inevitably be a demand for corresponding miniaturization of MCM.

Requisites for the miniaturization of MCM include reduction in size of LSIs to be mounted, high-density formation of wiring patterns, etc. In the case of a flip chip used as an LSI, its pad pitch is said to become as small as 0.07 mm or thereabout in future. Accordingly, a multilayer wiring board also, on which flip chips are mounted, needs to be formed with high-density wiring patterns matching such fine pad patterns.

As such multilayer wiring boards, a ceramic wiring board using a ceramic material and a buildup wiring board using a glass-reinforced epoxy resin etc. are generally known. A ceramic wiring board is produced using a green sheet, and a through hole is formed in the green sheet by punching. A wiring pattern is printed on the green sheet by using an electrically conductive ink. A large number of green sheets thus formed with the through hole and the wiring pattern are stacked up and are baked at high temperature under high pressure, thereby forming a wiring board having layered wiring patterns. To produce a buildup wiring board, on the other hand, a copper-clad, glass-reinforced epoxy resin is used as a starting material. After a through hole is formed using a drill, a conductive layer is formed on the inner wall of the through hole by plating to achieve conductor connection between the opposite surfaces of the copper-clad, glass-reinforced epoxy resin. Subsequently, a wiring pattern (hereinafter core layer) is formed, and an organic insulating layer (hereinafter buildup layer) is formed on one or both surfaces of the material having the wiring formed thereon. Then, the buildup layer alone is removed using a laser or by etching at locations corresponding to interlayer connecting portions, and the individual layers are interconnected by means of plating, thereby forming a multilayer wiring board.

In the case of the ceramic wiring board, however, since the wiring pattern is printed on a green sheet, it is difficult to form a high-density wiring pattern.

Further, in the ceramic wiring board, a through hole is formed by punching, and thus it is difficult to form a small-diameter through hole. As a result, the land has an increased width corresponding to the diameter of the through hole, also making it difficult to enhance the density of the wiring pattern.

On the other hand, in the case of the buildup wiring board, the coefficient of thermal expansion (16 ppm/° C.) of the plated copper formed between the copper foil constituting the core layer and the glass-reinforced epoxy resin greatly differs from the coefficient of thermal expansion (80 ppm/° C.) of the glass-reinforced epoxy resin in the thickness direction thereof. In order to eliminate inconvenience such as wiring disconnection caused by the difference in the coefficient of thermal expansion, therefore, the thickness of the plated copper must be 20 μm or more. Further, the underside of the copper foil constituting the core layer is roughened in the order of 3 to 5 μm to ensure satisfactory adhesion strength when the copper foil is laminated on the resin, and therefore, the roughening thickness of 3 to 5 μm must also be allowed for. Thus, even if an ultra-thin copper foil is used, the total thickness of the copper foil, including the plated copper and the roughening thickness, becomes 35 μm or more. When such a thick copper film is etched, the amount of side etching tends to increase, giving rise to a problem that the wiring of the core layer cannot be made fine.

Further, in the buildup wiring board, a through hole is formed by drilling, and thus it is difficult to form a through hole with a diameter of 0.3 mm or less. As a result, the land has an increased width corresponding to the diameter of the through hole, also making it difficult to enhance the density of the wiring pattern.

SUMMARY OF THE INVENTION

The present invention was created in view of the above circumstances, and an object thereof is to provide a multilayer printed wiring board which permits the formation of fine wiring patterns, thereby increasing the density of wiring patterns.

It is another object of the present invention to provide a process of producing a multilayer printed wiring board which permits the formation of fine wiring patterns, thereby increasing the density of wiring patterns.

To achieve the first object, there is provided a multilayer printed wiring board comprising a glass substrate having a through hole connecting opposite surfaces thereof, a plurality of insulating layers and wiring layers formed on the surfaces of the glass substrate, and a conducting portion having a conductive film formed on an inner wall surface of the through hole and providing conductor connection between the opposite surfaces of the glass substrate. In the multilayer printed wiring board, the conductive film has a thickness of 1 to 20 μm, and a protective layer is formed so as to cover at least the conductive film.

To achieve the second object, a process of producing a multilayer printed wiring board is provided which comprises the step of forming a through hole in a glass substrate so as to connect opposite surfaces thereof, the step of forming a plurality of insulating layers and wiring layers on the surfaces of the glass substrate, the step of coating the through hole with a conductive film to provide conductor connection between the opposite surfaces of the glass substrate, and the step of covering the conductive film with a protective layer.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 2(A) and 2(B) are sectional views illustrating a step of forming a through hole in photosensitive glass, wherein FIG. 2(A) shows the formation of an exposure-crystallized portion at a through hole-forming portion by irradiation of ultraviolet rays onto the photosensitive glass, and FIG. 2(B) shows the formation of a through hole by selective removal of the through hole-forming portion by dissolution from the photosensitive glass;

FIGS. 4(A), 4(B), 4(C) and 4(D) are sectional views of a multilayer printed board in a conductive film coating step, wherein FIG. 4(A) shows the formation of a sputtering chromium layer formed as the barrier layer, FIG. 4(B) shows the filling of resin into the through hole, FIG. 4(C) shows the removal of superfluous portions of the resin protruding from the through hole, and FIG. 4(D) shows the removal of the sputtering chromium layer formed as the barrier layer to expose a copper film;

FIGS. 7(A), 7(B) and 7(C) are sectional views illustrating a through hole formation step, wherein FIG. 7(A) shows an origin positioning through hole formed in alkali-free glass, FIG. 7(B) shows a through hole formed halfway in the alkali-free glass, and FIG. 7(C) shows the through hole formed through the alkali-free glass;

FIGS. 8(A) and 8(B) are sectional views illustrating another through hole formation step, wherein FIG. 8(A) shows an origin positioning through hole formed in alkali-free glass, and FIG. 8(B) shows a through hole formed through the alkali-free glass;

DESCRIPTION OF THE PREFERRED EMBODIMENTS

Embodiments of the present invention will be hereinafter described with reference to the drawings.

A first embodiment will be described first.

Figure 1:
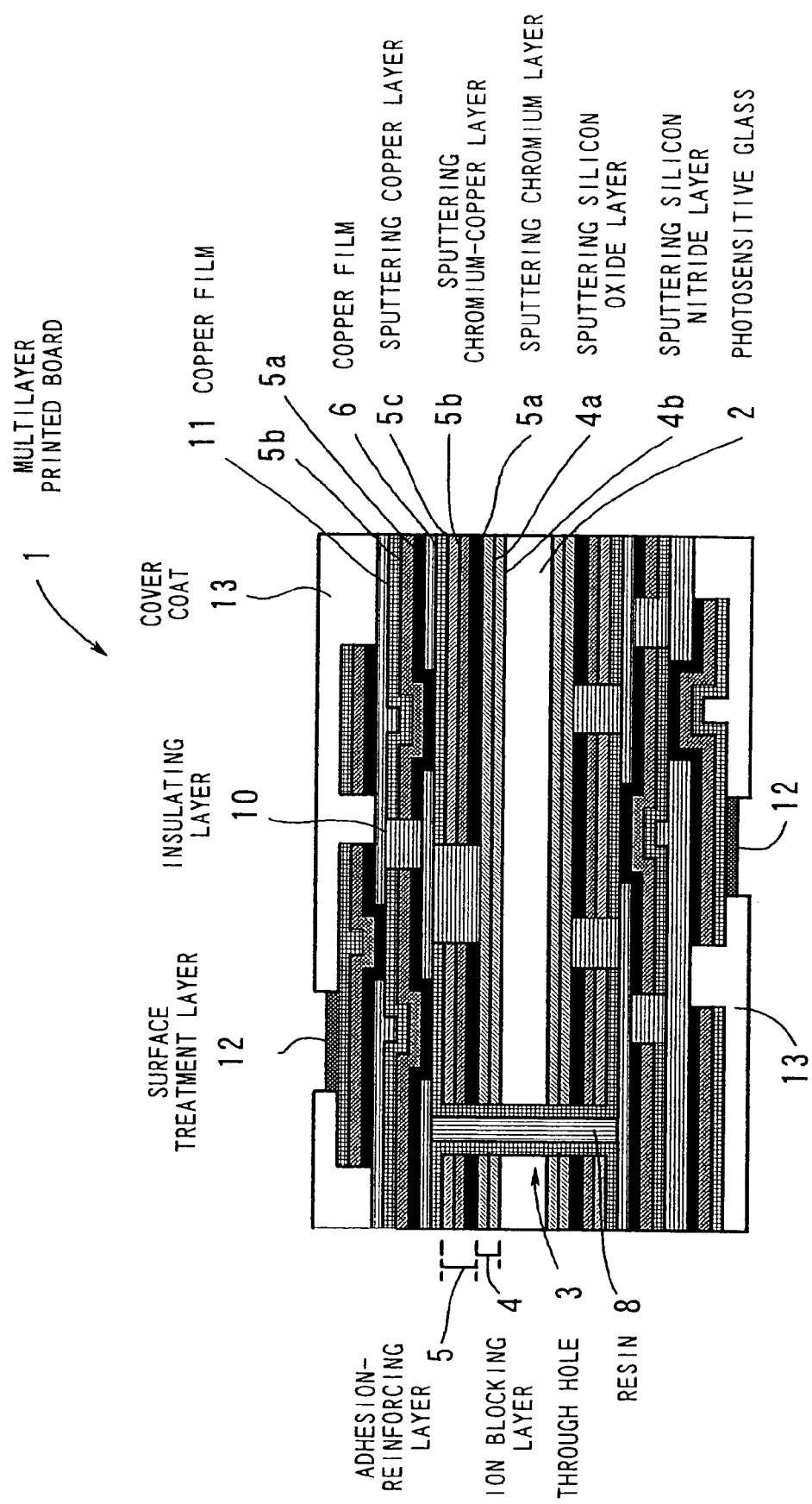
FIG. 1 is a sectional view of a multilayer printed board.

FIG. 1 is a sectional view of a multilayer printed board 1 according to this embodiment.

The multilayer printed board 1 has a photosensitive glass 2 which is a glass substrate constituting the core of the multilayer printed board 1, a through hole 3 extending through the photosensitive glass 2 from one to the other surface thereof, and an ion blocking layer 4 for suppressing leak of alkali metal ions etc. from the photosensitive glass 2.

In this embodiment, the ion blocking layer 4 is made up of a sputtering silicon oxide layer 4a and a sputtering silicon nitride layer 4b. A copper film 6, which is the lowermost wiring layer and serves also as a conductive film for providing conductor connection between the opposite surfaces of the photosensitive glass 2 is formed on an adhesion-reinforcing layer 5 for maintaining and enhancing the adhesion with the copper film 6. The adhesion-reinforcing layer 5 includes a sputtering chromium layer 5a, a sputtering chromium-copper layer 5b, and a sputtering copper layer 5c. The multilayer printed board further includes a copper film 11 as a laminated wiring layer, an insulating layer 10 interposed between wiring layer patterns, a resin 8 serving as a protective layer covering the copper film 6 inside the through hole 3, a surface treatment layer 12 covering a surface conducting portion of the multilayer printed board 1, and a cover coat 13 covering the surface of the multilayer printed board 1 except the surface conducting portion.

The glass substrate used in this case is made of a material most suited as the core substrate in terms of characteristics including smoothness, hardness and insulating performance, and may be photosensitive glass as exemplified in this embodiment, chemically strengthened glass such as soda-lime glass, crystallized glass, alkali-free glass, aluminosilicate glass, etc.

The sputtering silicon nitride layer 4b is formed on the opposite surfaces of the photosensitive glass 2, and the sputtering silicon oxide layer 4a is formed on the outer surface of the sputtering silicon nitride layer 4b. The insulating layer 10 and the sputtering chromium layer 5a are situated on the outer surface of the sputtering silicon oxide layer 4a, and on the outer surface of the sputtering chromium layer 5a, the sputtering chromium-copper layer 5b and the sputtering copper layer 5c are successively arranged. The copper film 6 is formed on the outer surface of the sputtering copper layer 5c as well as on the inner wall surface of the through hole 3, and conductor connection is established between part of the copper film 6 formed on the outer surface of the sputtering copper layer 5c and the copper film 6 formed on the inner wall surface of the through hole 3. The resin 8 is filled into the interior of the through hole 3 of which the inner wall surface has been coated with the copper film 6. On the outer surface of the wiring layer formed in this manner, the sputtering chromium layer 5a and the sputtering chromium-copper layer 5b are formed as the adhesion-reinforcing layer 5, and further, the copper film 11 and the insulating layer 10 are formed as an outer layer. The adhesion-reinforcing layer 5, the copper film 6 and the insulating layer 10 are successively stacked in like manner on the laminate structure, thus forming a laminated circuit pattern. As an outermost layer of the laminated circuit pattern formed in this manner, the cover coat 13 and the surface treatment layer 12 are formed.

A process of producing the multilayer printed board 1 will be now described.

The production process for the multilayer printed board 1 according to the present invention comprises a through hole formation step, an ion blocking layer formation step, a wiring layer and conductive film formation step, a conductive film coating step, an etching step, an insulating layer formation step, a wiring layer formation step, and a surface treatment step.

A step of modifying the glass substrate may be added as needed. Characteristics of the glass to be modified include physical characteristics such as hardness, flexural strength, coefficient of thermal expansion, etc., optical characteristics such as transmittance, refractive index, etc., chemical characteristics such as ion migration properties etc., and electrical characteristics such as dielectric constant, dielectric loss tangent, etc.

The glass substrate can be modified by crystallizing the glass substrate in its entirety, for example. By performing such crystallization, it is possible to modify as desired the characteristics of the glass substrate such as flexural strength, coefficient of thermal expansion, and transmittance.

Further, the glass substrate may be modified for the purpose of controlling the surface conditions of the substrate, for example, smoothness, cleanness, wettability, etc.

FIG. 2 illustrates the step of forming the through hole 3 in the photosensitive glass 2.

In the through hole formation step, first, a mask is placed on the surface of the photosensitive glass 2, and ultraviolet rays are selectively irradiated only onto a portion of the photosensitive glass 2 where the through hole 3 is to be formed. The material of the photosensitive glass 2 is not particularly limited, and any material may be used insofar as it contains a photosensitive component and shows photosensitivity. As the photosensitive component, preferably at least one of, more preferably two or more of Au, Ag, $Cu_2O$ and $CeO_2$ are contained.

As the glass substrate used in the present invention, a photosensitive glass containing, for example, 55 to 85% $SiO_2$, 2 to 20% $Al_2O_3$, and 5 to 15% $Li_2O$ ($SiO_2+Al_2O_3+Li_2O>85\%$) as a basic component; 0.001 to 0.05% Au, 0.001 to 0.5% Ag, and 0.001 to 1% $Cu_2O$ as a photosensitive metallic component; and 0.001 to 0.2% $CeO_2$ as a photosensitizer, all by wt %, is especially preferred.

The mask to be used for the formation of the through hole is not particularly limited, and a mask of any desired type may be used insofar as it has an opening corresponding in position to the through hole to be formed, can be brought into close contact with the photosensitive glass 2, and permits selective exposure of the photosensitive glass 2. As such a mask, a mask having a pattern of film formed on a thin transparent glass plate and substantially opaque to the exposure light such as ultraviolet rays, for example, a chromium film, may be used.

Figure 2A:
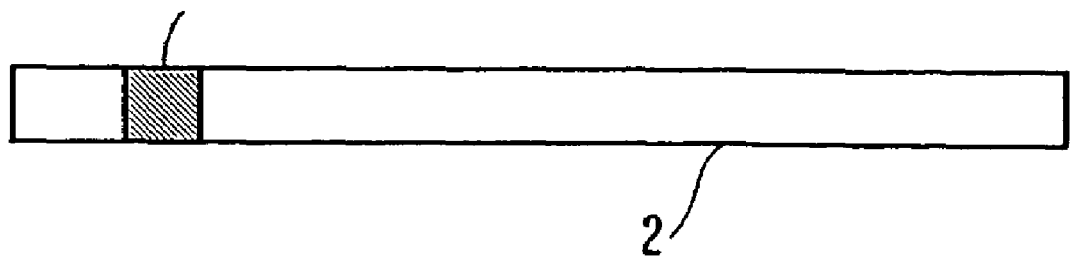

That portion of the photosensitive glass 2 at which the through hole 3 is to be formed is selectively irradiated with ultraviolet rays through the mask, whereupon an exposure-crystallized portion 2a is formed due to the irradiation at the through hole-forming portion, as shown in FIG. 2(A).

The glass substrate having the exposure-crystallized portion 2a formed therein is then subjected to heat treatment. The heat treatment is preferably carried out at a temperature between the transition point and yield point of the glass used. At temperatures lower than the transition point, satisfactory heat treating effects are not obtained, and at temperatures exceeding the yield point, shrinkage occurs, possibly lowering the dimensional accuracy. The heat treatment is preferably performed for a period of about 30 minutes to 5 hours.

Figure 2B:
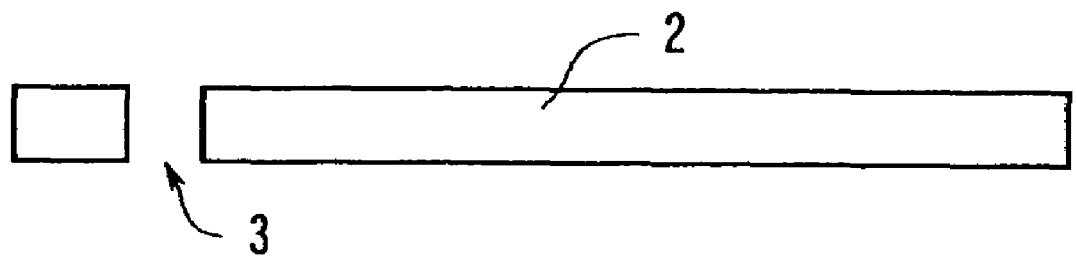

Subsequently, the heat-treated photosensitive glass 2 is immersed in dilute hydrofluoric acid and the exposure-crystallized portion 2a alone is etched. Due to the etching, the through hole-forming portion alone is selectively removed by dissolution from the photosensitive glass 2, as shown in FIG. 2(B), so that the through hole 3 is formed. By using a photolithography technique for the through hole formation in the photosensitive glass 2, it is possible to simultaneously form a desired number of through holes 3 with an aspect ratio of about 10. For example, where the photosensitive glass 2 used has a thickness of about 0.3 to 1.5 mm, a plurality of through holes with a small diameter of about 30 to 150 μm can be formed simultaneously at desired locations. This permits the formation of fine wiring patterns and also serves to shorten the time required for the through hole formation step.

Where a landless structure is employed in which the land width is reduced to a very small value or zero in order to increase the density of wiring patterns, sufficiently large space can be secured between the through holes and thus wiring can be arranged also in the space between the through holes, expanding the degree of freedom in wiring design.

Also, the through holes can be formed at a narrow pitch, whereby the wiring density can be increased.

Prior to the formation of a thin film such as a wiring layer on the substrate, a glass substrate modification step, for example, crystallization of the entire glass substrate, may be additionally carried out.

By adding such a step, it is possible to improve the characteristics of the glass substrate, for example, to obtain increased mechanical strength and heat resistance, compared with the original photosensitive glass, to control the coefficient of thermal expansion, and to suppress ion migration.

For example, where the glass substrate is in its entirety crystallized to make the coefficient of thermal expansion of the crystallized glass substrate close to that of a metallic material constituting the wiring layer, defects such as wiring disconnection or hole breakout can be prevented from being caused by repeated expansion and contraction due to heat history, even if a landless structure is employed to form a narrow-pitch, high-density wiring pattern.

The crystallization of the entire glass substrate may be performed following the formation of the through hole, by irradiating ultraviolet rays onto the entire substrate and then heat-treating the substrate. In this case, conditions for the crystallization are suitably selected in accordance with characteristics of the crystallized glass substrate to be obtained, so as to control the kind, size, quantity, etc. of crystals to be formed.

Figure 3A:
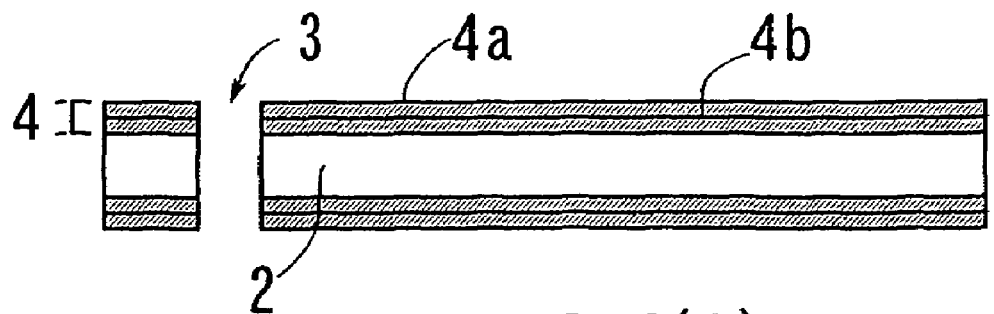
FIG. 3(A) is a sectional view illustrating an ion blocking layer formation step.

FIG. 3(A) is a sectional view illustrating the ion blocking layer formation step in which the sputtering silicon oxide layer 4a and the sputtering silicon nitride layer 4b are formed on the opposite surfaces of the photosensitive glass 2.

In cases where the photosensitive glass 2 contains alkali metal ions such as $Li^+$, $Na^+$, etc., measures need to be taken against short circuit induced by ion migration. Ion migration is a phenomenon that alkali metal ions move on an insulator with long-sustained application of voltage and finally cause a short circuit between electrodes, and is a cause of lowering of the reliability of the multilayer printed board 1. According to this embodiment, to prevent a short circuit from being caused by ion migration, an ion blocking layer 4 consisting of the sputtering silicon oxide layer 4a and the sputtering silicon nitride layer 4b is formed on the opposite surfaces of the photosensitive glass 2, thereby preventing the alkali metal ions from leaking from the photosensitive glass 2 to the copper film 6, the insulating layer 10, etc. Consequently, even in the case where the glass used contains ionic impurities, ion migration can be effectively suppressed, and also sufficient insulation resistance is ensured even if the film thickness is small.

When forming the ion blocking layer 4, first, a dealkalizing process is performed to remove alkali metal ions contained in the opposite surfaces of the photosensitive glass 2. The dealkalization is carried out by immersing the photosensitive glass 2 in an electrolyte such as a sulfuric acid solution, and then applying an electric field to the photosensitive glass 2 to allow alkali metal ions contained in the opposite surfaces of the photosensitive glass 2 to dissolve in the electrolyte.

After the dealkalization, the ion blocking layer 4 is formed on each of the opposite surfaces of the photosensitive glass 2. The ion blocking layer 4 may be made of either an organic material or an inorganic material; preferably, the material used should have good insulating performance, have a coefficient of thermal expansion such that the difference in coefficient of thermal expansion between the ion blocking layer and the glass is small, and should also be excellent in heat resistance, moisture resistance, and electrical characteristics. Such materials include, for example, $SiO_2$, $Si_3N_4$, $Al_2O_3$, etc. Among these, $SiO_2$ and $Si_3N_4$ are especially preferred because they are free from defects such as pinholes, have high integrity as an insulating film, and also are high in withstand voltage.

The film formation method is not particularly limited and sputtering, vacuum evaporation, CVD, etc. may be used; however, sputtering is preferred since it provides good adhesion. In this embodiment, the sputtering silicon nitride layer 4b is formed on the opposite surfaces of the photosensitive glass 2, and the sputtering silicon oxide layer 4a is formed on the outer surface of the sputtering silicon nitride layer, as shown in FIG. 3(A). Although in this embodiment the ion blocking layer 4 is formed after dealkalizing the photosensitive glass 2, only one of the dealkalizing process and the formation of the ion blocking layer 4 may be performed. The glass substrate referred to in relation to the present invention includes those provided with the ion blocking layer 4.

Figure 3B:
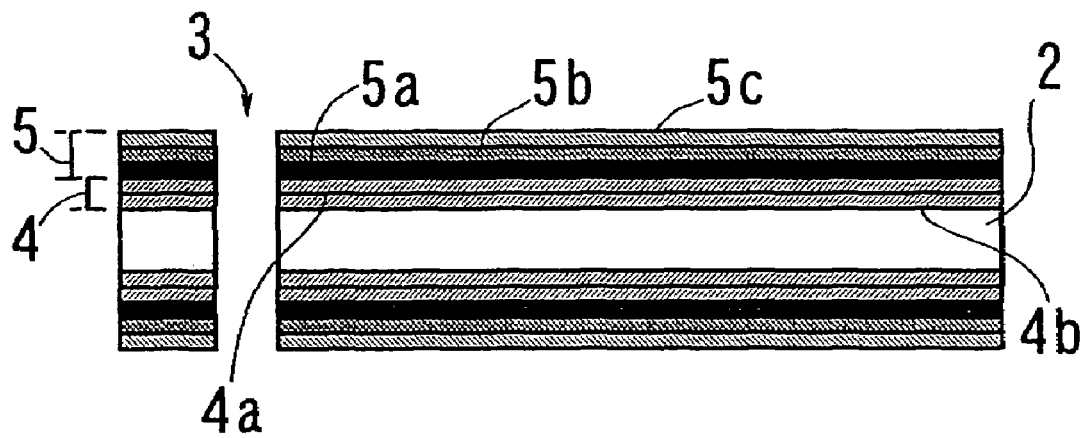
FIGS. 3(B) and 3(C) are sectional views illustrating a wiring layer and conductive film formation step.
Figure 3C:
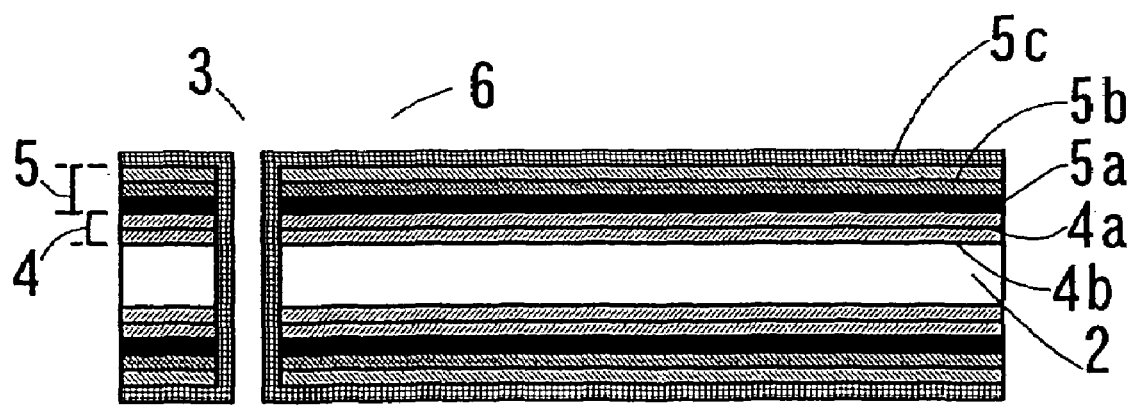

After completion of the ion blocking layer formation step, the wiring layer and conductive film formation step is carried out. FIGS. 3(B) and 3(C) are sectional views illustrating the wiring layer and conductive film formation step.

The lowermost wiring layer is formed by plating or the like. In cases where the adhesion between the material of the lowermost wiring layer and the material of the ion blocking layer 4 on which the lowermost wiring layer is formed is poor, the adhesion-reinforcing layer 5 is interposed between the lowermost wiring layer and the ion blocking layer 4, thereby to enhance the strength of adhesion with the wiring layer. For the adhesion-reinforcing layer 5, a material having good adhesion with both the lowermost wiring layer and the ion blocking layer 4, for example, chromium, tantalum, titanium, etc., is used, and a film consisting of such a material is formed on the surface of the ion blocking layer 4 by sputtering, vacuum evaporation, CVD, etc. Alternatively, the adhesion-reinforcing layer 5 may have a three-layer structure such that between a material having good adhesion with the lowermost wiring layer and a material having good adhesion with the ion blocking layer 4, a mixture of these materials is interposed. In the case where no ion blocking layer is formed, a material having good adhesion with both the lowermost wiring layer and the core substrate is used for the adhesion-reinforcing layer 5. Also in this case, the adhesion-reinforcing layer 5 may have a three-layer structure, as in the case of forming the ion blocking layer.

In this embodiment, copper is used as the material of the lowermost wiring layer, and the adhesion-reinforcing layer 5 has a three-layer structure consisting of the sputtering chromium layer 5a, which has good adhesion with the sputtering silicon oxide layer 4a, the sputtering copper layer 5c, which has good adhesion with the copper film 6 as the lowermost wiring layer, and the sputtering chromium-copper layer 5b interposed between these layers. FIG. 3(B) is a sectional view showing the adhesion-reinforcing layer 5 having this structure. In this embodiment, the adhesion-reinforcing layer 5 is formed by sputtering; specifically, as shown in FIG. 3(B), the sputtering chromium layer 5a is formed on the sputtering silicon oxide layer 4a, the sputtering chromium-copper layer 5b is formed on the sputtering chromium layer, and the sputtering copper layer 5c is formed on the sputtering chromium-copper layer. The individual layers constituting the adhesion-reinforcing layer 5 should preferably have as small a thickness as possible, taking account of the amount of side etching in the subsequent wiring layer patterning by etching, described later. If, however, the thickness of each of the layers forming the adhesion-reinforcing layer 5 is too small, the layer 5 may possibly be removed during a pretreatment performed prior to the subsequent formation of the copper film 6. Where chromium is used for the adhesion-reinforcing layer 5, for example, the sputtering chromium layer 5a preferably has a thickness of about 0.04 to 0.1 μm. The sputtering chromium-copper layer 5b, which is the intermediate layer, preferably has a thickness of about 0.04 to 0.1 μm, and the sputtering copper layer 5c preferably has a thickness of about 0.5 to 1.5 μm. Thus, in this step, a very thin adhesion-reinforcing layer 5 with an overall thickness of 2 μm or less is formed.

Subsequently, the wiring layer and the conductive film are formed. In this embodiment, the lowermost wiring layer and the conductive film are formed as a single copper film 6, as shown in FIG. 3(C), and this copper film 6 is formed uniformly so as to cover the surface of the adhesion-reinforcing layer 5 as well as the inner wall surface of the through hole 3. Thus, the copper film 6 provides conductor connection between the opposite surfaces of the multilayer printed board 1 via the through hole 3. The copper film 6 is formed by plating such as electroplating and electroless plating. Electroplating and electroless plating have their respective advantages and disadvantages. Electroplating is advantageous in that the time required for plating is short, compared with electroless plating, but is disadvantageous in that the deposited film is poor in uniformity and in adhesion. On the other hand, electroless plating is advantageous in that the film formed by electroless plating is excellent in uniformity and adhesion, compared with that formed by electroplating, but is disadvantageous in that longer time is required for plating. Preferably, therefore, a copper layer of 1 μm thick or less is deposited first by electroless plating, and then the copper layer is thickened by electroplating.

Like the adhesion-reinforcing layer 5 mentioned above, the thickness of the copper film 6 should preferably be as small as possible, in consideration of the amount of side etching. However, if the multilayer printed board 1 is used in an environment in which it undergoes repeated temperature changes, metal fatigue of the copper film 6 may develop due to the difference in coefficient of thermal expansion between the copper film 6 and the photosensitive glass 2. To ensure connection reliability of the copper film 6 without the possibility of metal fatigue, therefore, the copper film 6 needs to have a somewhat large thickness. The photosensitive glass 2 used in the present invention has a coefficient of thermal expansion closer to that of copper, than a core substrate using a glass-reinforced epoxy resin having a coefficient of thermal expansion of 80 ppm/° C. (Z direction). For example, the photosensitive glass 2 has a coefficient of thermal expansion of approximately 8.4 ppm/° C. in a thickness direction thereof, which is almost half the coefficient of thermal expansion of the copper film 6, that is, 16 ppm/° C. Accordingly, compared with the case of using a glass-reinforced epoxy resin or the like, change of the stress applied to the copper film 6 can be lessened, and as a consequence, reliable connection is ensured even if the thickness of the copper film 6 is reduced. In this embodiment, the thickness of the copper film 6 is preferably set to about 1 to 20 μm, more preferably, about 4 to 7 μm. If the thickness of the copper film 6 is smaller than 1 μm, it is highly possible that disconnection of the copper film 6 will be caused due to the metal fatigue mentioned above; on the other hand, if the thickness of the copper film 6 is larger than 20 μm, then it is difficult to form a fine wiring layer pattern.

The multilayer printed board 1 having the copper film 6 formed thereon is then subjected to the conductive film coating step. FIG. 4 shows, in section, the multilayer printed board 1 in the conductive film coating step.

Figure 4A:
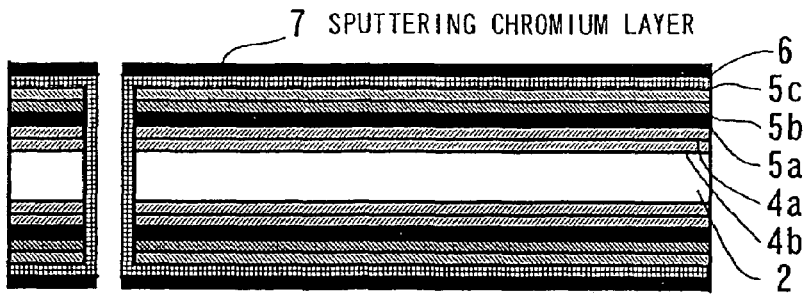

In the conductive film coating step, a barrier layer is formed first. The barrier layer is formed on the outer surface of the copper film 6 except the inner wall surface of the through hole 3, to protect the copper film 6 during polishing, mentioned later. Thus, polishing can be performed without damaging the copper film 6 having a very small thickness. The material of the barrier layer should have mechanical strength high enough to withstand polishing, and also should be easily removed from the copper film 6 since the barrier layer needs to be removed after the polishing. As a material having such characteristics, chromium, tantalum, titanium, etc. are preferred, and using such a material, the barrier layer is formed by sputtering, vacuum evaporation, CVD, plating, etc. FIG. 4(A) is a sectional view showing a sputtering chromium layer 7 formed as the barrier layer by sputtering using chromium. The thickness of the barrier layer may vary depending on the kind of the material used as the barrier layer, the kind of an abrasive used and polishing conditions, but should preferably be as small as possible in consideration of the subsequent removal of the barrier layer following the polishing. For example, where chromium is used as the material of the barrier layer and unnecessary portions of resin are removed by roll grinding using a buffing material, the barrier layer preferably has a thickness of about 0.1 μm.

Figure 4B:
Figure 4C:
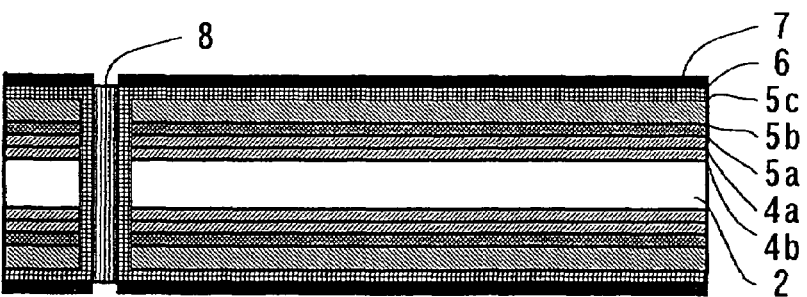
Figure 4D:

Then, as shown in FIG. 4(B), a resin 8 is selectively filled into the through hole 3 by screen printing etc. The resin 8 used may be either an insulating resin or a conductive resin. After the resin 8 is filled, superfluous portions of the resin 8 protruding from the through hole 3 are removed by a polishing machine using a buffing material etc., as shown in FIG. 4(C). Following the polishing, the sputtering chromium layer 7 alone is selectively removed, so that the copper film 6 is exposed as shown in FIG. 4(D). Thus, the resin 8 is filled in order to protect the copper film 6 formed on the inner wall surface of the through hole 3, and accordingly, the thickness of the copper film 6 can be reduced. Also, since the substrate surface inclusive of the through hole 3 can be made flat, a resist film for forming a resist pattern and the insulating layer 10, mentioned later, can be formed easily. Further, as a result of the resin filling, air in the interior of the through hole 3 can be removed, and thus inconveniences caused by expansion of air due to change in environmental temperature, such as cracking of the insulating layer 10 etc., can be eliminated, whereby the reliability is enhanced.

Figure 5A:
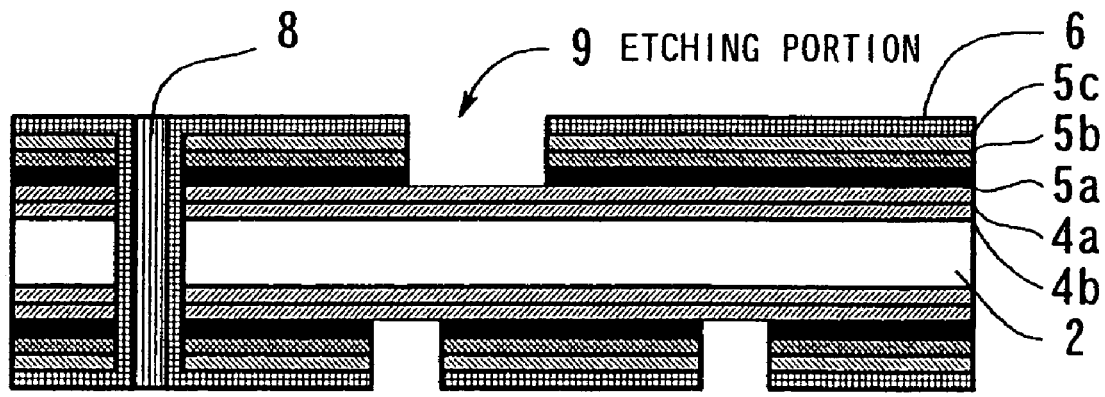
FIG. 5(A) is a sectional view of the multilayer printed board from which etching portions have been removed.

The etching step will be now described. FIG. 5(A) is a sectional view of the multilayer printed board 1 from which etching portions 9 have been removed by etching. In the etching step, a resist pattern corresponding to the wiring layer pattern is formed on the outer surface of the multilayer printed board 1 shown in FIG. 4(D), and those portions of the copper film 6, sputtering copper layer 5c, sputtering chromium-copper layer 5b and sputtering chromium layer 5a which are not covered with the resist are removed by etching, thus forming the lowermost wiring layer pattern. Since all through holes 3 have been filled with the resin 8, the resist used in this step may be liquid resist, dry film resist, or electrodeposited resist. Also, the resist type may be either positive or negative; however, positive resist is suited for the formation of fine wiring pattern since it generally provides higher resolution.

In the case of the patterning by etching, the surface region near the resist can be etched almost congruently with the resist pattern. However, with increasing distance from the resist, a shape error between the resist pattern and the wiring pattern formed by etching increases. Namely, the thicker the metal layer to be etched, the larger shape error occurs in the lower or deeper portion of the metal layer. To form a fine wiring pattern, such error must be minimized, and to minimize the error, it is necessary that the thickness of the metal layer should be as small as possible. In this embodiment, since the photosensitive glass 2 having a coefficient of thermal expansion close to that of copper is used as the core substrate, as mentioned above, the copper film 6 can be made as thin as approximately 1 to 20 μm, and as a consequence the lowermost wiring pattern can also be made fine. In general, the thickness of the metal layer and the width of the wiring pattern formed by etching are in the ratio 1:2; accordingly, where the sputtering chromium layer 5a, the sputtering chromium-copper layer 5b and the sputtering copper layer 5c have a total thickness of about 0.5 to 5 μm, the overall thickness of the metal layer including the copper film 6 becomes 1.5 to 25 μm, so that a wiring pattern with a width of about 3 to 50 μm can be formed. Preferably, the copper film 6 has a thickness of 4 to 7 μm, and the sputtering chromium layer 5a, the sputtering chromium-copper layer 5b and the sputtering copper layer 5c have an overall thickness of 0.58 to 1.7 μm, so that a wiring pattern with a width of approximately 9 to 20 μm can be formed.

The width of the land (land width) of the through hole should preferably be 10 μm or less, more preferably 8 μm or less, further preferably 5 μm or less. The smaller the land width of the through hole, the more space can be secured between the through holes, so that additional wiring may be arranged, for example, thus expanding the degree of freedom in wiring design.

Also, the through holes can be formed at a narrower pitch, making it possible to increase the density of wiring pattern.

Figure 5B:
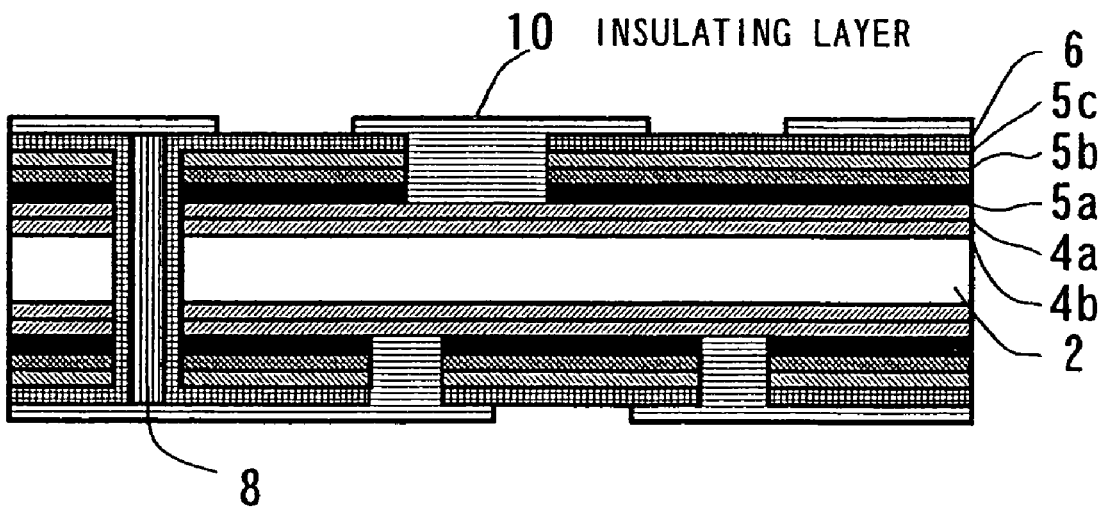
FIG. 5(B) is a sectional view of the multilayer printed board on which an insulating layer has been formed.

The insulating layer formation step will be now described. FIG. 5(B) is a sectional view of the multilayer printed board 1 on which an insulating layer has been formed.

In the insulating layer formation step, the insulating layer 10 is formed on one or both surfaces of the multilayer printed board 1 which has been etched as shown in FIG. 5(A). As the material of the insulating layer 10, those having a coefficient of thermal expansion relatively close to that of the photosensitive glass 2 and excellent in heat resistance and moisture resistance are preferred. Polyimide resin, heat-resistant epoxy resin, polyamide resin, etc. are preferred as organic materials, and glass (SOG), $SiO_2$, $Si_3N_4$, $Al_2O_3$, etc. are preferred as inorganic materials. Organic materials generally have a large coefficient of thermal expansion as compared with the photosensitive glass 2; however, no particular problem arises if a layer of an organic material of about 10 μm thick is formed because the coefficient of thermal expansion thereof shifts and becomes substantially equal to that of the photosensitive glass 2.

In cases where an organic material is used for the insulating layer 10, the insulating layer 10 is formed by spin coating, curtain coating, slot coating or the like. In this embodiment, since the transparent photosensitive glass 2 is used as the core substrate, light to which one surface of the photosensitive glass 2 is exposed transmits through the transparent glass and may affect the patterning on the other surface. Preferably, therefore, the insulating layer 10 is formed on one surface at a time. Where an opaque photosensitive glass is used as the core substrate, the light to which one surface of the glass is exposed for the formation of the insulating layer 10 does not affect the other surface, and accordingly, the opposite surfaces of the glass may be simultaneously exposed to light.

On the other hand, in cases where an inorganic material is used for the insulating layer 10, the insulating layer may be formed by sputtering, vacuum evaporation, CVD, etc., besides the aforementioned coating processes. After the insulating layer 10 is formed, only those portions of the insulating layer 10 at which conductive connection is to be established with a wiring layer laminated in a subsequent step are selectively removed. In this case, the insulating layer 10 is preferably removed (hereinafter via hole) in conical form to improve the throwing power or connectivity with respect to the conductive metal of other layers.

Figure 6:
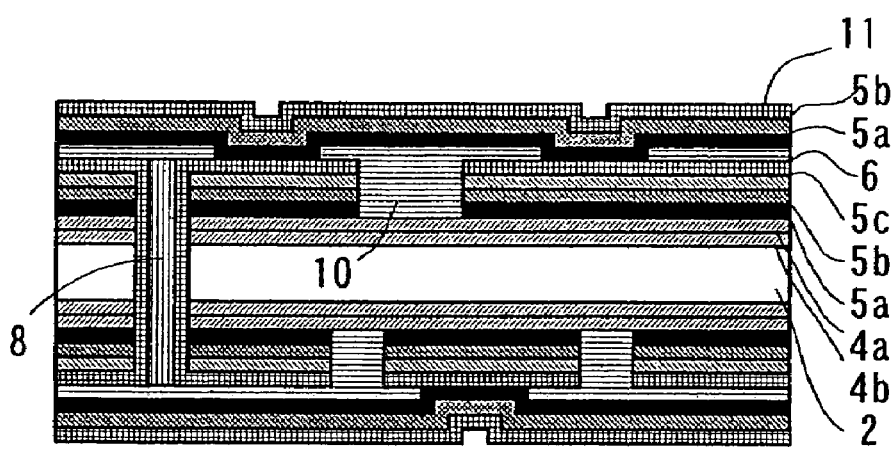
FIG. 6(A) is a sectional view of the multilayer printed board on which a wiring layer has been formed in a wiring layer formation step.
FIG. 6(B) is a sectional view of the multilayer printed board of which the wiring layer has been patterned by again performing an etching step and an insulating layer formation step.
FIG. 6(C) is a sectional view of the multilayer printed board illustrating a surface treatment step.
Figure 6:
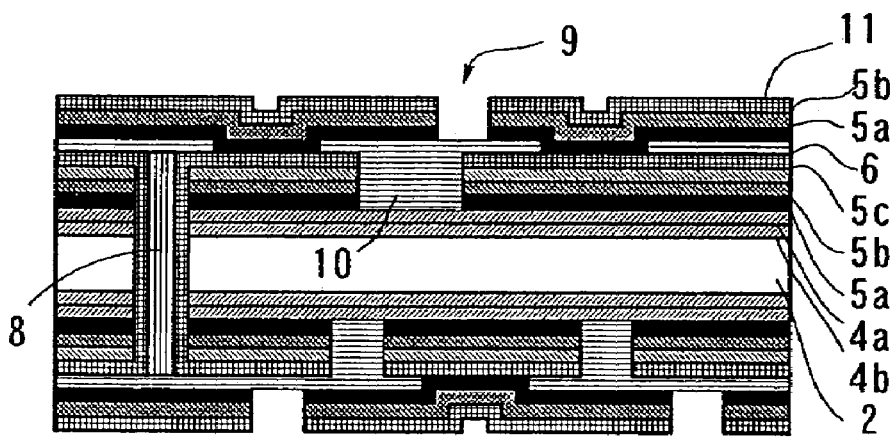
Figure 6:
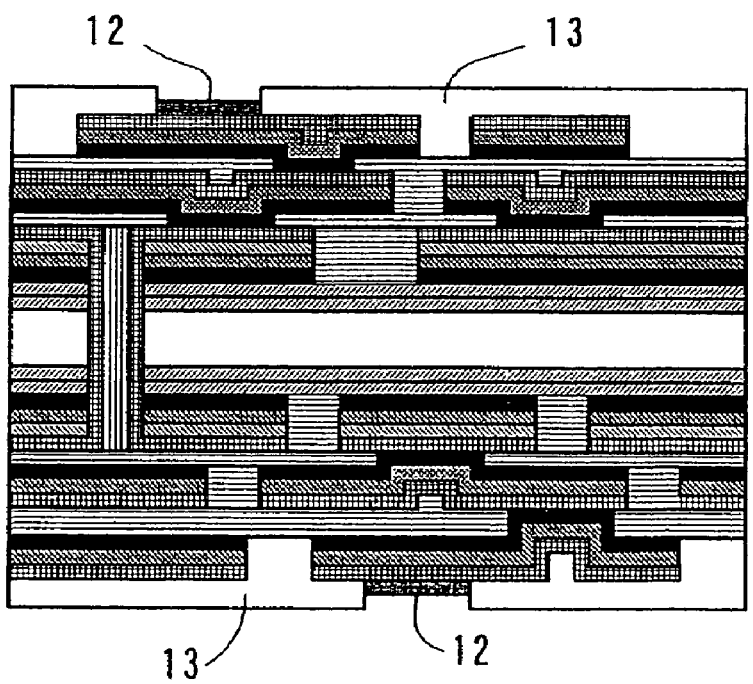

After the via holes are formed as shown in FIG. 5(B), the wiring layer formation step is carried out to form an additional wiring layer. FIG. 6(A) is a sectional view of the multilayer printed board 1 which has been subjected to the wiring layer formation step to form a wiring layer.

In the wiring layer formation step, a film having good adhesion with the insulating layer 10, for example, a film of chromium, tantalum, titanium or the like, is formed on the exposed surface of the insulating layer 10 and of the copper film 6 by sputtering, vacuum evaporation, CVD, etc., and on the thus-formed film, a film having good conductivity, for example, a copper film, is formed. In this case, if the film having good adhesion with the insulating layer 10 and the film to be formed on this film and having good conductivity have poor adhesion at their interface, a multilayer structure, for example, may be employed such that an intermediate layer made of a mixture of the material forming the film having good adhesion with the insulating layer 10 and the material forming the film having good conductivity is interposed between these films, thereby to improve the adhesion.

In the structure shown in FIG. 6(A), using chromium as the material of the film having good adhesion with the insulating layer 10, a sputtering chromium layer 5a is formed by sputtering, then a sputtering chromium-copper layer 5b is formed on the sputtering chromium layer, and using copper having good conductivity, a copper film 11 is formed by sputtering on the sputtering chromium-copper layer. The film (e.g., sputtering chromium layer 5a) having good adhesion with the insulating layer preferably has a thickness of approximately 0.04 to 0.1 μm, with which sufficient adhesion strength can be obtained. Also, where copper is used to form the film (e.g., copper film 11) having good conductivity, its thickness may be about 1 to 20 μm, with which reliable connection with the via holes is ensured and also the electrical resistance is small. In the case of the multilayer structure, the layer made of the mixture material (e.g., sputtering chromium-copper layer 5b as the intermediate layer) may have a thickness of 0.04 to 0.1 μm, and this thickness provides sufficient adhesion strength at the interfaces.

After the wiring layer formation step, the etching step and the insulating layer formation step are again carried out to form a wiring layer pattern, as shown in FIG. 6(B). The wiring layer formation step, the etching step and the insulating layer formation step are thereafter repeated in the same manner as described above, thereby forming wiring patterns one upon another.

After completion of the formation of laminated wiring patterns, the surface treatment step is performed.

In the surface treatment step, surface conducting portions of the outermost wiring layer are covered with a surface treatment layer 12, and the remaining portion of the outermost layer is covered with a cover coat 13, as shown in FIG. 6(C). The surface treatment layer 12 is made of a material having good conductivity, and solder, heat-resistant preflux, water-soluble preflux, nickel, gold plate, etc. may be used, for example. The cover coat 13 may be made of the inorganic or organic material used in the insulating layer 10, or solder resist etc. commonly known may be used.

In this manner, the photosensitive glass 2 having a coefficient of thermal expansion close to that of the copper film 6 is used as the core substrate, and the copper film 6 having a small thickness of 1 to 20 μm is formed on the inner wall surface of the through hole 3, so that the copper film 6 as the wiring layer formed continuously with the copper film in the through hole can be reduced in thickness, thus permitting the formation of fine wiring pattern.

Also, the copper film 6 formed on the inner wall surface of the through hole 3 is coated with the resin 8; therefore, even if the copper film 6 has a small thickness, reliable connection is ensured because the copper film is protected by the resin 8. This permits reduction of the thickness of the copper film 6 as the wiring layer formed continuously with the copper film 6 in the through hole, making it possible to form a fine wiring pattern.

Further, using the photosensitive glass 2 as the core substrate, the through hole-forming portion is selectively irradiated with ultraviolet rays and the portion exposed to the ultraviolet radiation is etched to form the through hole. It is therefore possible to form small-diameter through holes with high accuracy. Also, by modifying the glass substrate, it is possible to control the coefficient of thermal expansion as desired and thereby prevent wiring disconnection, hole breakout, etc. Accordingly, the land width can also be reduced, making it possible to increase the density of the wiring pattern.

Also, the through hole 3 is formed in the photosensitive glass 2 having a coefficient of thermal expansion close to that of the copper film 6, the copper film 6 is formed on the inner wall surface of the through hole 3 and also as a wiring layer, and with the interior of the through hole 3 filled with resin, the insulating layer 10 is formed. This makes it possible to produce the multilayer printed board 1 with fine wiring patterns.

In the foregoing description of the embodiment, the copper film 6 on the inner wall surface of the through hole 3 and the copper film 6 serving as a wiring layer are formed in an identical step, but may be formed in separate steps.

Also, in the above embodiment, the interior of the through hole 3 is filled with the resin 8. Instead of filling the resin, the resin 8 may be formed so as to cover at least the copper film 6 on the inner wall surface of the through hole 3.

Further, in the above embodiment, the ion blocking layer 4 is formed. However, in cases where a glass substrate containing no alkali metal ions is used or the glass substrate is in its entirety crystallized for modification so that ion migration can be suppressed, for example, the ion blocking layer 4 may be omitted.

EXAMPLE 1

An example according to the first embodiment will be now described.

In this example, a photosensitive glass (trade name: PEG3, manufactured by HOYA CORPORATION) having the composition stated below was used as the glass substrate.

|  | (wt %) |
|---|---|
| $SiO_2$ | 78.0% |
| $Li_2O$ | 10.0% |
| $Al_2O_3$ | 6.0% |
| $K_2O$ | 4.0% |
| $Na_2O$ | 1.0% |
| ZnO | 1.0% |
| Au | 0.003% |
| Ag | 0.08% |
| $CeO_2$ | 0.08% |

(Through Hole Formation Step)

1) With a mask held in close contact with the photosensitive glass, UV light was irradiated onto a through hole portion of the glass through the mask, thereby forming a latent image corresponding to the exposed portion. The mask used was made of silica glass patterned using chromium/chromium oxide. Subsequently, the photosensitive glass was heat-treated at 400° C. to crystallize only the exposed portion.

2) Dilute hydrofluoric acid (10% solution) was sprayed on both surfaces of the photosensitive glass to remove the crystallized through hole portion by dissolution, thereby forming a through hole with a diameter φ of 0.05 mm (50 μm).

(Ion Blocking Layer Formation Step)

3) The photosensitive glass having the through hole thus formed therein was immersed in an aqueous solution containing 20 vol % sulfuric acid and was applied with a voltage of +20 V for 10 minutes. The negative electrode used in this case was made of stainless steel.

4) Using a sputtering system, an $SiO_2$ film (thickness: 0.05 μm) was formed on an $Si_3N_4$ film of 0.05 μm thick, thereby forming an ion blocking layer.

(Wiring Layer and Conductive Film Formation Step)

5) Using the sputtering system, a chromium film with a thickness of 0.05 μm was formed.

6) A chromium-copper alloy film (chromium: 4%; copper: 96%) (thickness: 0.05 μm) was formed by using the sputtering system.

7) Also using the sputtering system, a copper film (thickness: 1.5 μm) was formed. The film formations 5) to 7) were all carried out continuously in an air-shutoff environment, to prevent oxides from being produced between adjacent metal films.

8) Subsequently, a copper film (thickness: 0.3 μm) was formed by electroless plating and then a copper film of 5 μm thick was built up by electroplating, thus forming a conductive film and a wiring layer at the same time as a continuous film.

(Conductive Film Coating Step)

9) Using the sputtering system, a thin chromium film of 0.1 μm thick was formed as a barrier layer on the surface of the wiring layer.

10) Using a screen printing plate having an opening formed therein only at a location corresponding to the through hole portion, a photosensitive epoxy resin (SPBR-8000, manufactured by SANWA CHEMICAL IND. CO., LTD.) was filled into the through hole with the use of a screen printing machine, thereby forming a protective layer.

11) Then, after the resin was predried at 90° C. for 30 minutes by using a hot air dryer, it was further cured with UV light energy of 1000 mj/cm² irradiated onto both sides of the through hole.

12) Using a roll buffing machine, portions of the epoxy resin protruding above or spreading around the opening edges of the through hole were removed by polishing.

13) Then, using the hot air dryer, the resin was completely cured by being dried at 150° C. for 60 minutes.

14) Subsequently, only the chromium layer serving as the barrier layer was selectively stripped off. As the stripping agent, a chemical containing potassium ferricyanide as a main component was used.

(Etching Step)

15) A positive liquid resist (MICROPOSIT SJR5440, manufactured by SHIPLEY COMPANY) was applied for a thickness of about 10 μm by using a spinner, and then using a glass mask, exposure was carried out at 1000 mj/cm² in a parallel light exposure system. Subsequently, using a developing solution (DEVELOPER 2500, from SHIPLEY COMPANY), development was performed by a dipping method at room temperature for 1 minute, to form a resist pattern.

16) After the wiring layer having the resist pattern formed thereon was sprayed with a solution of 40-Baumé ferric chloride to remove copper by etching, the resist was removed using acetone. Then, using a copper pattern as a metal resist, the chromium layer was etched to form a wiring pattern with a line width of 20 μm, a line spacing of 20 μm and a through hole land width of 120 μm.

As the etchant for removing chromium, a chemical containing potassium ferricyanide as a main component was used.

(Insulating Layer Formation Step)

17) Using the spinner, an interlayer insulating layer (MULTIPOSIT 9500, from SHIPLEY COMPANY) of about 10 μm thick was formed on one surface of the double-sided glass wiring board fabricated as described above.

18) Then, using a glass mask, exposure was performed with light energy of 1300 mj/cm² radiated from the exposure system, and the wiring board was dried at 80° C. for 10 minutes in the hot air dryer. Subsequently, development was carried out using a special developing solution.

19) Another interlayer insulating layer (MULTIPOSIT 9500, from SHIPLEY COMPANY) of about 10 μm thick was formed on the other surface of the wiring board by using the spinner, and after a via hole with a diameter φ of 20 μm was formed by exposure and development, the insulating layer was completely cured by hot-air drying in a nitrogen atmosphere at 170° C. for 4 hours.

The insulating layer was thus patterned on one surface at a time, because light-transmitting glass was used as the substrate and the exposure light could transmit through the glass substrate and reach the opposite surface.

(Wiring Layer Formation Step)

20) Using the sputtering system, a chromium layer of 0.05 μm thick was formed in the same manner as in the step of forming the first wiring layer described above.

21) Subsequently, a chromium-copper alloy layer (chromium: 4%; copper: 96%) with a thickness of 0.05 μm was formed using the sputtering system.

22) Also using the sputtering system, a copper film (thickness: 5 μm) was formed. The film formations 20) to 21) were all carried out continuously in an air-shutoff environment to prevent oxides from being produced between adjacent metal films.

(Etching Step)

23) A positive liquid resist (MICROPOSIT SJR5440, from SHIPLEY COMPANY) was applied for a thickness of about 10 μm by using the spinner, and then using a glass mask, exposure was carried out at 1000 mj/cm² in the parallel light exposure system. Subsequently, using a developing solution (DEVELOPER 2500, from SHIPLEY COMPANY), development was performed by a dipping method at room temperature for 1 minute, to form a resist pattern.

24) After the wiring layer having the resist pattern formed thereon was sprayed with a solution of 40-Baumé ferric chloride to remove copper by etching, the resist was removed using acetone. Finally, using a copper pattern as a metal resist, the chromium layer was etched to form a second-layer wiring pattern with a line width of 20 μm, a line spacing of 20 μm and a via land width of 50 μm.

As the etchant for removing chromium, a chemical containing potassium ferricyanide as a main component was used.

(Surface Treatment Step)

25) Using the spinner, an insulating layer (MULTIPOSIT 9500, from SHIPLEY COMPANY) of about 10 μm thick was formed as a cover coat on one surface of the four-layer glass wiring board fabricated as described above.

26) Then, using a glass mask, exposure was performed with light energy of 1300 mj/cm² radiated from the exposure system, and after the wiring board was dried at 80° C. for 10 minutes in the hot air dryer, development was carried out using a special developing solution.

27) Another interlayer insulating layer (MULTIPOSIT 9500, from SHIPLEY COMPANY) of about 10 μm thick was formed using the spinner on the other surface of the wiring board, and after exposure and development were performed, the wiring board was dried by hot-air drying in a nitrogen atmosphere at 170° C. for 4 hours.

28) As a surface treatment, the resulting wiring board was plated with nickel/gold by electroless plating.

In the manner described above, a high-density, double-sided multilayer printed wiring board having two layers of wiring pattern formed on each side of the glass substrate was obtained.

A second embodiment will be now described.

The second embodiment is a modification of the first embodiment described above, and a multilayer printed wiring board was fabricated in the same manner as in the first embodiment, except that alkali-free glass containing no alkali metal ions was used as the core substrate and that the through hole formation step was implemented by laser beam machining.

FIGS. 7 and 8 are sectional views illustrating the through hole formation step according to this embodiment.

In this embodiment, the through hole is formed by laser beam irradiation as mentioned above. The type of laser that can be used is not particularly limited, and excimer laser, yttrium-aluminum-garnet laser, carbon dioxide gas laser, argon gas laser, etc. may be used, for example. The following show the laser characteristics of a FEMTOSECOND LASER (CPA-2000), manufactured by HOYA CONTINUUM CORPORATION, as an example of laser to be used:

| | Condition |
|---|---|
| Energy | 600 μJ/cm² |
| Frequency | 1 kHz |
| Pulse width | 150 fs |
| Average output | 0.6 W |
| Peak power | 4 GW |
| Irradiation time | 1 s |

When the through hole is formed using a laser, the laser beam may be irradiated on one surface of the core substrate at a time, or may be simultaneously irradiated on both surfaces of same.

Figure 7A:
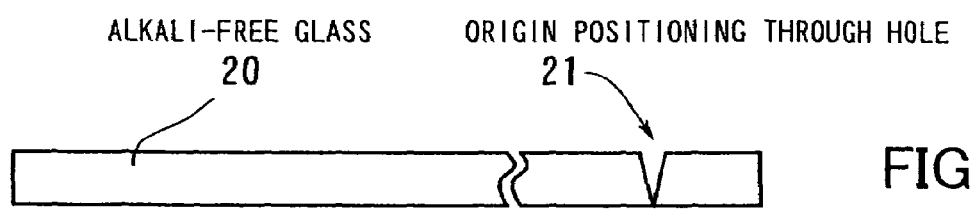
Figure 7B:
Figure 7C:
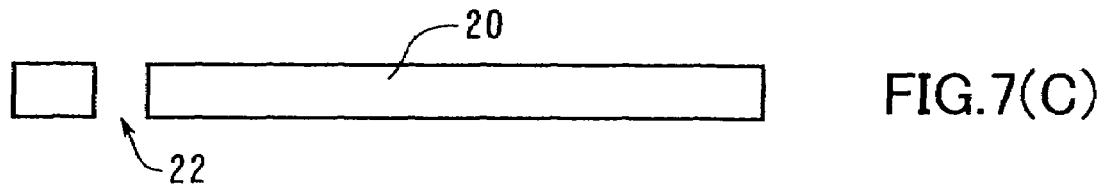

FIG. 7 illustrates the through hole formation step in which the laser beam is irradiated on one surface of the substrate at a time. In this case, first, the laser beam is irradiated onto one surface of alkali-free glass 20 to form a through hole for origin positioning, as shown in FIG. 7(A). Then, the laser beam is irradiated from one side of the alkali-free glass 20 onto a through hole-forming portion, to cut a through hole 22 halfway in the glass 20, as shown in FIG. 7(B). Subsequently, the laser beam is irradiated from the other side of the glass to make the through hole 22 penetrating the glass, as shown in FIG. 7(C).

Figure 8A:
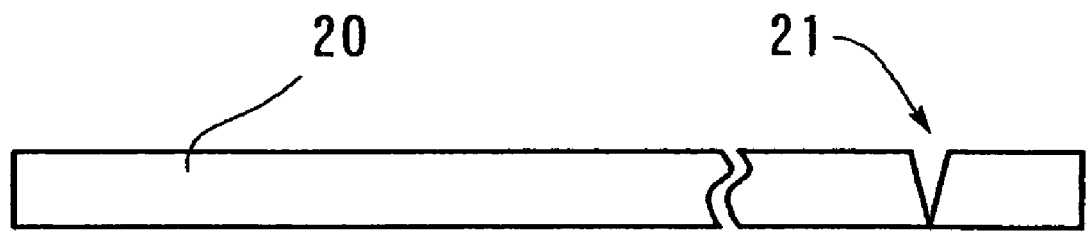
Figure 8B:
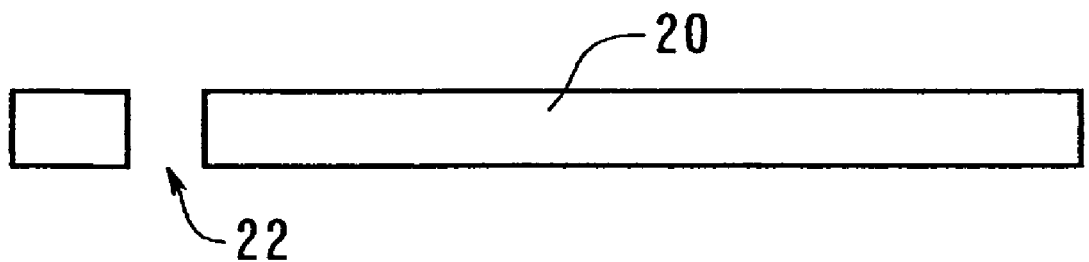

FIG. 8 illustrates the through hole formation step in which laser beams are simultaneously irradiated onto both surfaces of the substrate. Also in this case, an origin positioning through hole is formed, as shown in FIG. 8(A). Then, laser beams are simultaneously irradiated onto both surfaces of the alkali-free glass, to form the through hole 22 as shown in FIG. 8(B).

After completion of the through hole formation step, the wiring layer and conductive film formation step, the conductive film coating step, the etching step, the insulating layer formation step, the wiring layer formation step, and the surface treatment step were performed in the same manner as in the first embodiment, to fabricate the multilayer printed board 1.

Since, in this embodiment, the alkali-free glass 20 containing no alkali metal ions is used as the core substrate, the ion blocking layer need not be formed. In this embodiment, therefore, it is necessary that a material having good adhesion with the alkali-free glass 20 should be selected as the material of the adhesion-reinforcing layer 5.

Thus, in the second embodiment, a multilayer printed wiring board similar to that of the first embodiment could be fabricated using the alkali-free glass 20 as the substrate material.

Alternatively, using the photosensitive glass 2 as the substrate material, a through hole may be formed by laser beam machining. Also in this case, a small-diameter through hole can be formed with accuracy, and since it is possible to reduce the width of the land surrounding the opening of such a small-diameter through hole, the density of wiring patterns can be increased.

In this embodiment, the through hole is formed by machining the alkali-free glass with a laser beam; however, the through hole formation by laser beam machining is not limited to alkali-free glass but is applicable to other types of glass including photosensitive glass.

A third embodiment will be now described.

Using, as the substrate material, the same photosensitive glass material (trade name: PEG3, manufactured by HOYA CORPORATION) as used in Example 1, a multilayer wiring board was fabricated in almost the same manner as in Example 1, except that after the formation of the through hole, the glass was in its entirety modified by crystallization to improve the characteristics of the original photosensitive glass, as described in detail below.

(Through Hole Formation Step)

Figure 9A:
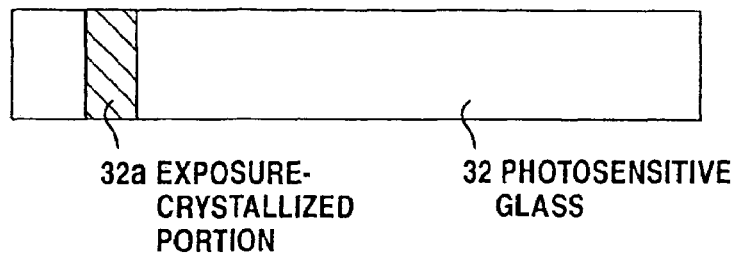
FIGS. 9(A) and 9(B) are sectional views illustrating a through hole formation step.
Figure 9B:
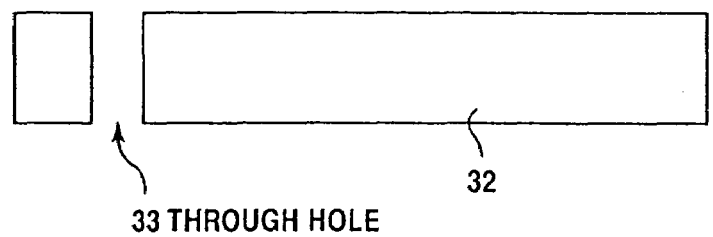

Following the same procedure as employed in Example 1, a through hole 33 (diameter φ: 50 μm) was formed (FIGS. 9(A) & 9(B)).

(Crystallization Step)

Figure 9C:
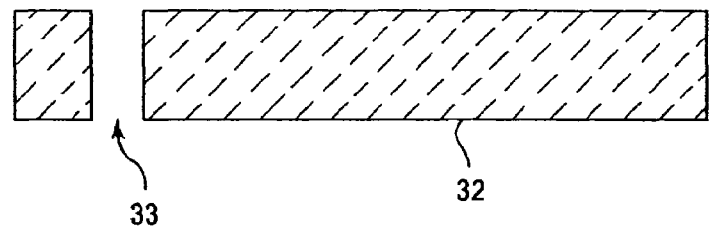
FIG. 9(C) is a sectional view illustrating a crystallization step.

The photosensitive glass 32 having the through hole 33 thus formed therein was in its entirety irradiated with ultraviolet rays for 30 seconds. Subsequently, the glass substrate was heat-treated at a temperature higher than the yield point thereof for about 2 hours, to crystallize the entire substrate (FIG. 9(C)).

This additional step serves to enhance, for example, the ion blocking effect, so that the ion blocking layer, which was formed in Example 1, was unnecessary.

Further, the flexural strength of the glass substrate could be increased to a value twice or more as large as that of the original photosensitive glass, and also the coefficient of thermal expansion of the glass substrate could be controlled to almost the middle value between those of an LSI chip and a copper-clad, glass-reinforced epoxy resin (FR4) typically used in printed wiring boards.

(Wiring Layer and Conductive Film Formation Step)

Then, following the same procedure as employed in Example 1, a thin chromium film of 0.05 μm thick (sputtering chromium layer 35a), a thin chromium-copper alloy (chromium: 4%; copper: 96%) film of 0.05 μm thick (sputtering chromium-copper layer 35b), and a thin copper film of 1.5 μm thick (sputtering copper layer 35c) were formed.

Like Example 1, the formations of these films were all carried out continuously in an air-shutoff environment to prevent oxides from being produced between adjacent metal films.

Figure 9D:
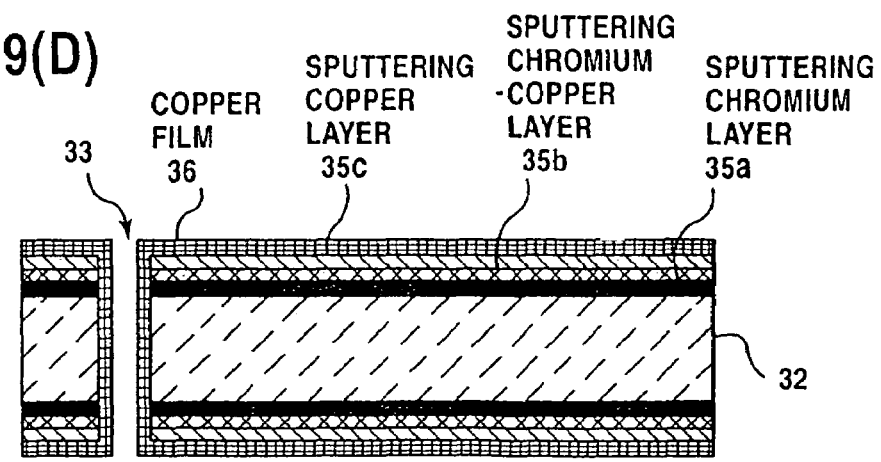
FIG. 9(D) is a sectional view illustrating a wiring layer and conductive film formation step.

Subsequently, a thin copper film (thickness: 0.3 μm) was formed by electroless plating and then a thin copper film (thickness: 5 μm) was built up by electroplating, thus forming a conductive film and a wiring layer at the same time as a continuous film (copper film 36) (FIG. 9(D)).

(Conductive Film Coating Step)

Then, following the same procedure as used in Example 1, a thin chromium film (thickness: 0.1 μm) was formed as a barrier layer on the surface of the wiring layer. Subsequently, using a screen printing machine, a photosensitive epoxy resin (SPBR-8000, from SANWA CHEMICAL IND. CO., LTD.) was filled into, the through hole, and after the resin was predried at 90° C. for 30 minutes by using a hot air dryer, it was cured with UV light irradiated thereon, thus coating the conductive film.

Figure 10:
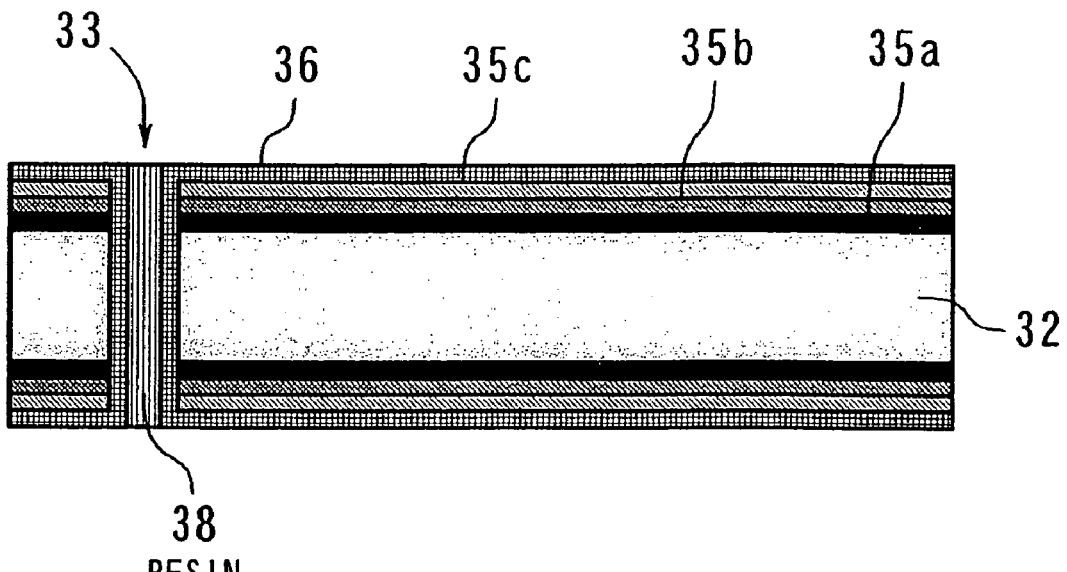
FIG. 10(A) is a sectional view illustrating a conductive film coating step.
FIG. 10(B) is a sectional view illustrating a resist pattern formation step.
Figure 10:
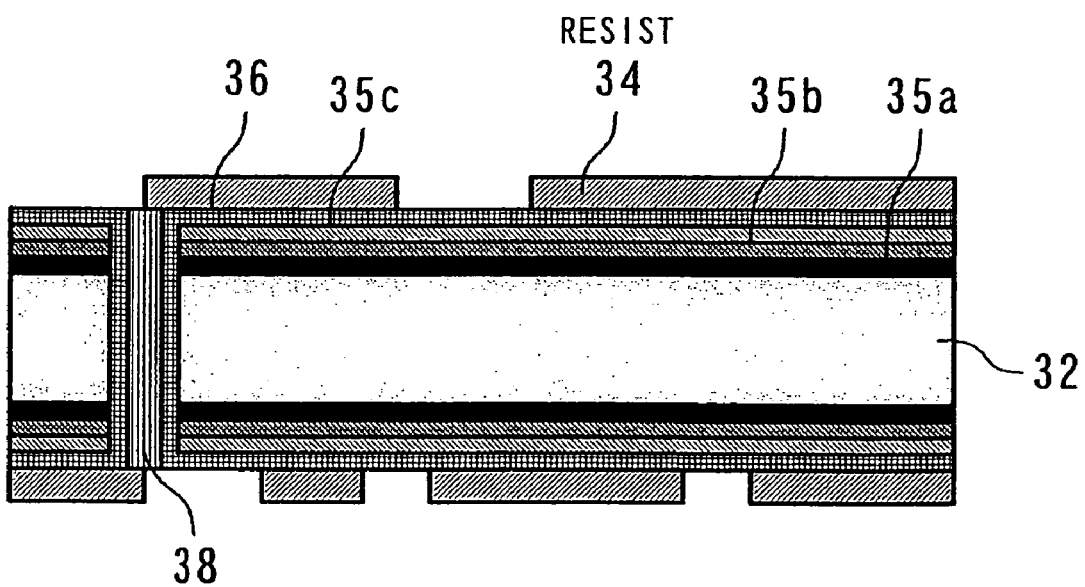

Using a roll buffing machine, portions of the epoxy resin protruding above or spreading around the opening edges of the through hole, as shown in FIG. 4(B), were removed by polishing. Then, using the hot air dryer, the resin was completely cured by being dried at 150° C. for 60 minutes, thus forming a protective layer (resin 38) for the conductive film (FIG. 10(A)).

Subsequently, only the thin chromium layer serving as the barrier layer was selectively stripped off, in the same manner as in Example 1.

(Resist Pattern Formation Step)

A positive liquid resist (MICROPOSIT SJR5440, from SHIPLEY COMPANY) was applied for a thickness of about 10 μm by using a spinner, and then using a glass mask, exposure was carried out at 1000 mj/cm² in a parallel light exposure system. Subsequently, using a developing solution (DEVELOPER 2500, from SHIPLEY COMPANY), development was performed by a dipping method at room temperature for 1 minute, to form a resist pattern (resist 34) (FIG. 10(B)).

(Etching Step)

Figure 11:
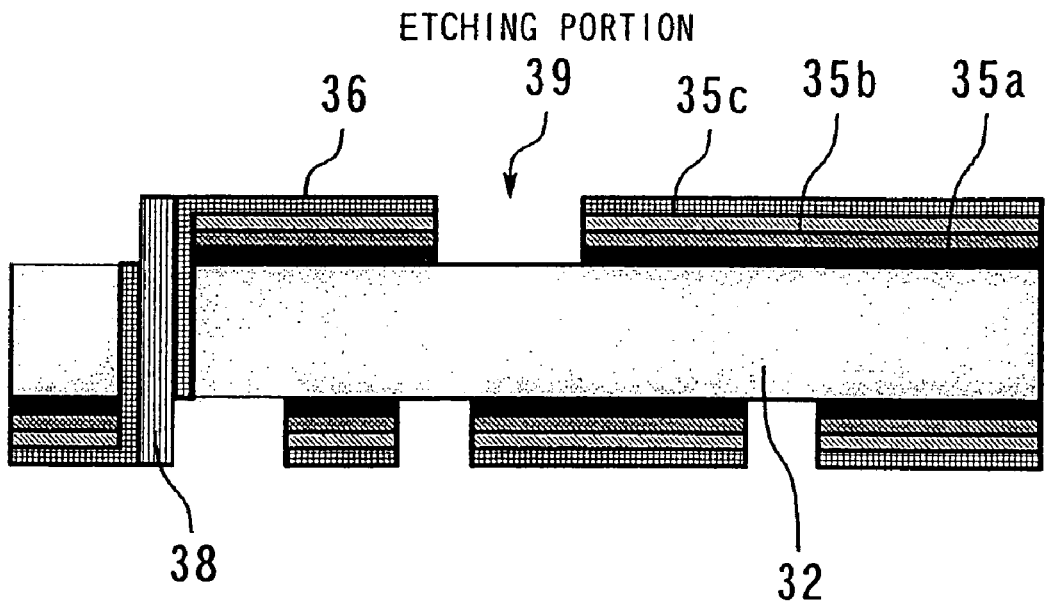
FIG. 11(A) is a sectional view illustrating an etching step.
FIG. 11(B) is a sectional view illustrating an insulating layer formation step.
Figure 11:
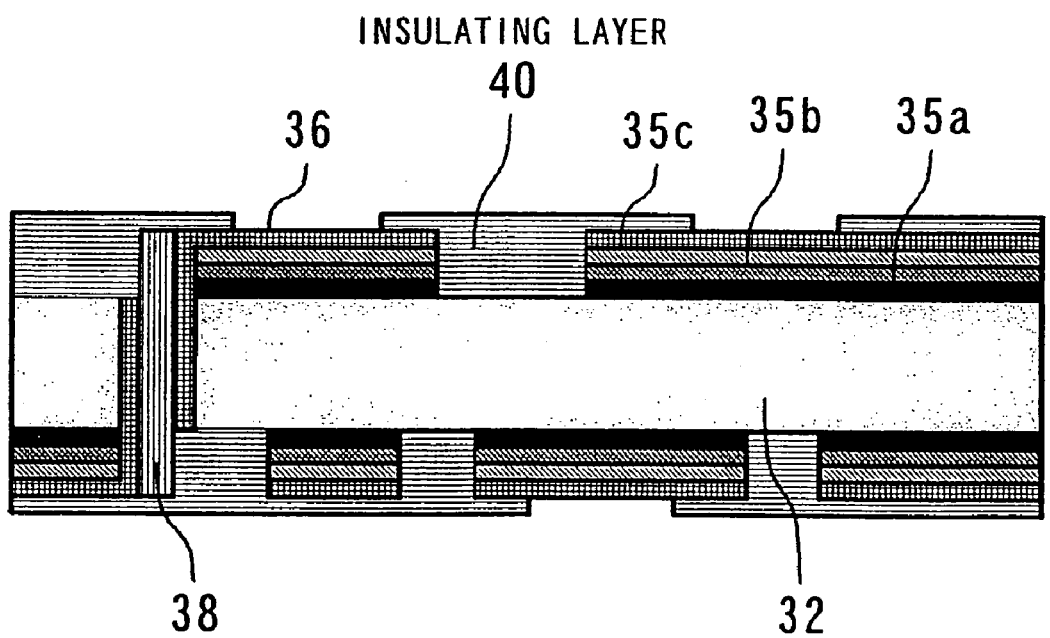
Figure 13:
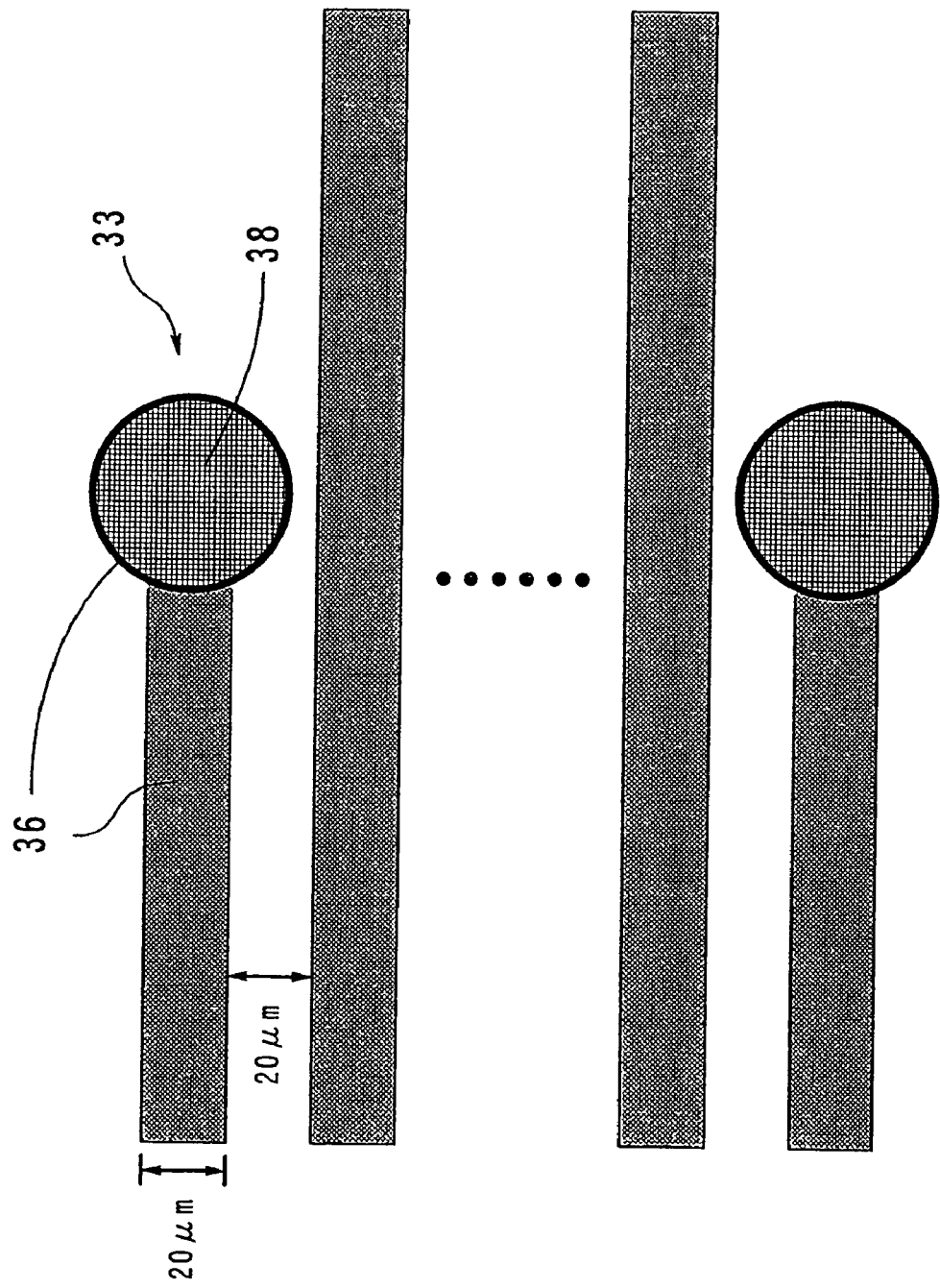
FIG. 13 is a plan view showing an example of a wiring pattern of landless structure.

Following the same procedure as employed in Example 1, the wiring layer having the resist pattern formed thereon was sprayed with a solution of 40-Baumé ferric chloride to remove copper by etching, and the resist was removed using acetone. Then, using a copper pattern as a metal resist, the chromium layer was etched to form a wiring pattern with a line width of 20 μm, a line spacing of 20 μm and a zero land width (FIGS. 11(A) & 13).

(Insulating Layer Formation Step)

Using the spinner, an interlayer insulating layer (MULTIPOSIT 9500, from SHIPLEY COMPANY) of about 10 μm thick was formed on one surface of the double-sided glass wiring board fabricated as described above. Then, using a glass mask, exposure was performed with light energy of 1300 mj/cm² radiated from the exposure system, and the wiring board was dried at 80° C. for 10 minutes in the hot air dryer. Subsequently, development was carried out using a special developing solution, to form an insulating layer 40 (FIG. 11(A)).

In like manner, another interlayer insulating layer (MULTIPOSIT 9500, from SHIPLEY COMPANY) of about 10 μm thick was formed on the other surface of the wiring board by using the spinner, and after a via hole with a diameter φ of 20 μm was formed by exposure and development, the insulating layer was dried by hot-air drying in a nitrogen atmosphere at 170° C. for 4 hours to be completely cured.

In this case, where the crystallized glass substrate used is opaque to the exposure light, the insulating layer patterning may be performed simultaneously on both surfaces of the board.

(Wiring Layer Formation Step)

Figure 12:
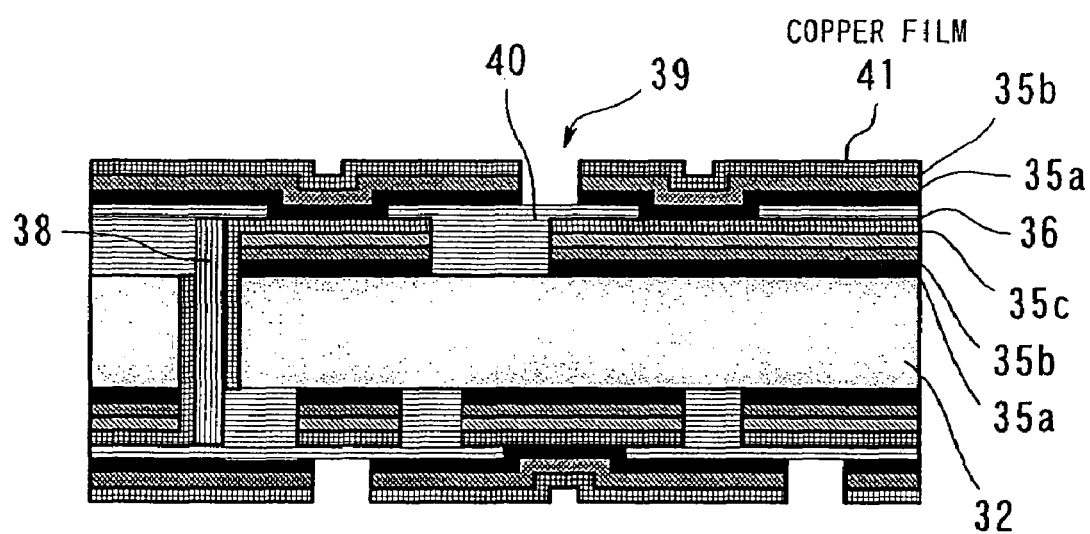
FIG. 12(A) is a sectional view illustrating a wiring layer formation step.
FIG. 12(B) is a sectional view illustrating an etching step and a surface treatment step.
Figure 12:
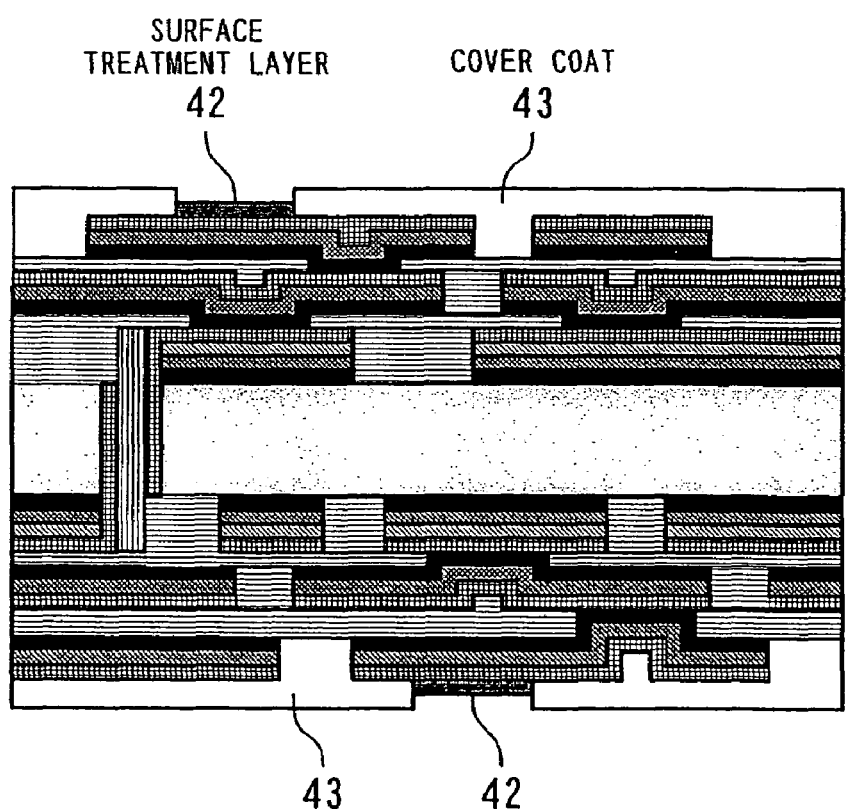

The process for forming the first wiring layer was repeated again, to form a thin chromium film (thickness: 0.05 μm) (sputtering chromium layer 35a), a thin chromium-copper alloy (chromium: 4%; copper: 96%) film of 0.05 μm thick (sputtering chromium-copper layer 35b), and a thin copper film of 5 μm thick (copper film 41) individually by sputtering (FIG. 12(A)).

(Etching Step)

A positive liquid resist (MICROPOSIT SJR5440, from SHIPLEY COMPANY) was applied for a thickness of about 10 μm by using the spinner, and then using a glass mask, exposure was carried out at 1000 mj/cm² in the parallel light exposure system. Subsequently, using a developing solution (DEVELOPER 2500, from SHIPLEY COMPANY), development was performed by a dipping method at room temperature for 1 minute, to form a resist pattern.

After the wiring layer having the resist pattern formed thereon was sprayed with a solution of 40-Baumé ferric chloride in the same manner as in Example 1 to remove copper by etching, the resist was removed using acetone. Finally, using a copper pattern as a metal resist, the chromium layer was etched to form a second-layer wiring pattern with a line width of 20 μm, a line spacing of 20 μm and a via land diameter of 50 μm.

(Surface Treatment Step)

Using the spinner, an interlayer insulating layer (MULTIPOSIT 9500, from SHIPLEY COMPANY) of about 10 μm thick was formed as a cover coat 43 on one surface of the four-layer, double-sided wiring board fabricated as described above. Then, using a glass mask, exposure was performed with light energy of 1300 mj/cm$^2$ radiated from the exposure system, and after the wiring board was dried at 80° C. for 10 minutes in the hot air dryer, development was carried out using a special developing solution.

Another interlayer insulating layer (MULTIPOSIT 9500, from SHIPLEY COMPANY) of about 10 μm thick was formed using the spinner on the other surface of the wiring board, and after exposure and development were performed, the wiring board was dried by hot-air drying in a nitrogen atmosphere at 170° C. for 4 hours.

Finally, the wiring board was surface-treated by electroless nickel/gold plating (surface treatment layer 42), thereby obtaining a high-density, four-layer printed wiring board having two layers of wiring pattern formed on each surface of the glass substrate (FIG. 12(B)).

With respect to the crystallized glass substrate used in Example 2, the effects of modification of glass characteristics were evaluated.

Figure 14:
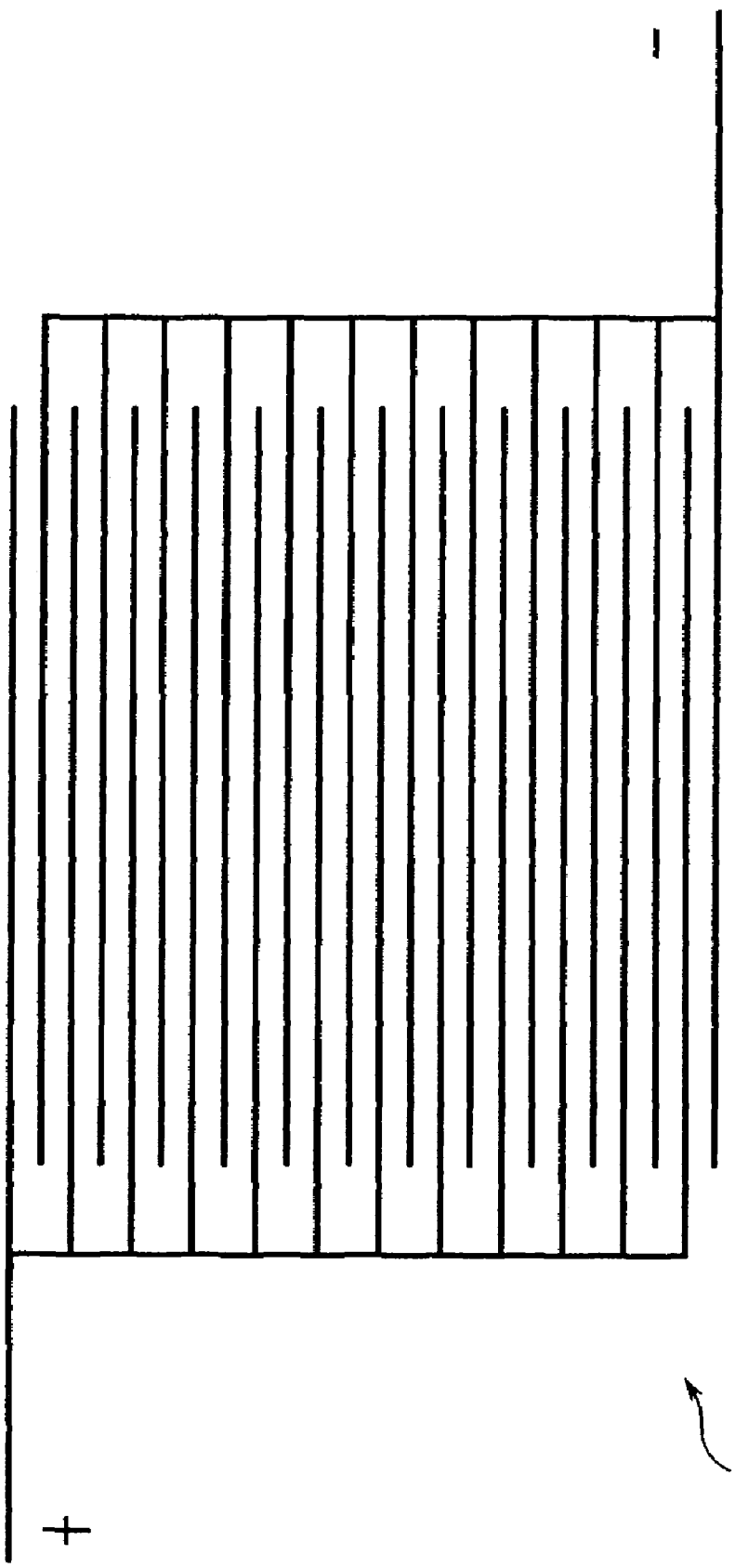
FIG. 14 is a schematic view of comb patterns formed for the purpose of an ion migration accelerated test.

First, as shown in FIG. 14, a pair of comb patterns (regarded as lines; spacing: 40 μm; a total of 125 lines) having a metal film composition containing copper as its main component, like the wiring layer, were arranged opposite to each other such that teeth of the two comb patterns were alternately arranged, and one comb pattern was connected to a positive electrode while the other to a negative electrode, thereby forming a typical wiring pattern for ion migration accelerated testing which had a distance (regarded as spacing) between adjacent teeth equal to a tooth width of 40 μm.

This wiring pattern was continuously applied with a voltage of 5 V for 500 hours in an atmosphere of 85° C. and 85%.

As a result, the crystallized glass substrate used in Example 2 showed no voltage drop or the like that was caused by electrode short circuit or leak touch due to ion migration, and it was confirmed that the glass substrate had excellent resistance to ion migration.

Namely, thanks to the crystallization of the glass substrate, alkali ions etc. contained in the surface region and inside of the glass were made less liable to move, compared with the original photosensitive glass. It is therefore unnecessary to form an ion blocking layer, thus simplifying the fabrication process for multilayer printed boards.

Also, the flexural strength of the crystallized glass substrate was measured and found to be twice or more as large as that of the photosensitive glass, proving excellent physical characteristics.

Further, the dielectric constant and dielectric loss tangent of the crystallized glass substrate were measured and found to be smaller than those of the original photosensitive glass, proving that the crystallized glass substrate has excellent electrical characteristics and is more suited for use as the material of multilayer printed boards.

In the multilayer printed wiring board according to the third embodiment, the land width of the through holes was set to zero and the diameter of the via hole was further reduced, so that sufficiently large space could be secured between the through holes, permitting wiring to be arranged between the through holes and thereby further expanding the degree of freedom in wiring design. Also, since the line spacing and the line width can be further reduced, this multilayer printed wiring board is remarkably advantageous in that it permits further increase in the density of wiring patterns.

In the third embodiment, moreover, the diameter of the landless through hole was set to 50 μm and the diameter of the via land of the second-layer wiring pattern was also set to an identical value of 50 μm. Thus, the condition for laying out the wiring round the land is the same for the first and second layers, and it can therefore be said that the degree of freedom in wiring pattern design is expanded.

The multilayer printed boards fabricated according to the individual embodiments were subjected to heat cycle test (1000 cycles each being an interval of 30 min. at 125° C.~−65° C.). As a result, none of the multilayer printed boards showed defects such as wiring disconnection or hole breakout, and the connection reliability of the through holes and via holes was not damaged at all.

The third embodiment in particular showed no defects such as wiring disconnection or hole breakout even after the heat cycle was repeated more than 2000 times.

As described above, in the multilayer printed wiring board according to the present invention, a glass substrate having a coefficient of thermal expansion close to that of a conductive film as well as that of a silicon chip is used as the core substrate, and accordingly, the conductive film can be made as thin as 1 to 20 μm, permitting the formation of fine wiring patterns.

Also, in the multilayer printed wiring board, the conductive film is coated with a protective layer; therefore, even if the conductive film formed is thin, sufficiently high connection reliability is ensured, so that the conductive film and the wiring layer can be reduced in thickness, making it possible to form fine wiring patterns.

Further, using glass as the core substrate, through holes are formed by exposure or by laser beam machining, and this makes it possible to form small-diameter through holes. Also, the land width of small-diameter through holes can be reduced, permitting further increase in the density of wiring patterns.

In the production process for a multilayer printed wiring board, glass is used as the substrate material, whereby a difference in coefficient of thermal expansion between the substrate material and the conductive film can be reduced. Also, in the production process, a through hole is formed in the glass substrate, a conductive film is formed on the inner wall surface of the through hole, and with the conductive film coated with resin, an insulating layer and a wiring layer are formed, whereby a multilayer printed board having fine wiring patterns can be produced.

Further, after the through hole is formed, a step of modifying the entire glass substrate by, for example, crystallization may be additionally performed.

This additional step makes it possible to obtain improved mechanical strength and heat resistance, compared with the original glass substrate, to control the coefficient of thermal expansion and also to suppress ion migration. Since ion migration can be suppressed, it is unnecessary to form an ion blocking layer on the glass substrate, thus simplifying the production process.

Also, the coefficient of thermal expansion of the crystallized glass substrate can be made close to that of a metallic material forming the wiring layer. Thus, even in cases where a landless structure is employed to form narrow-pitch, high-density wiring patterns, for example, defects such as wiring disconnection or hole breakout, which are caused by repeated expansion and contraction due to heat history, can be prevented.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A printed wiring board comprising:
    a glass substrate having a through hole connecting opposite surfaces thereof;
    a wiring layer formed over each of the surfaces of said glass substrate; and
    a conducting portion having a conductive film formed on an inner wall surface of the through hole and providing conductor connection between the opposite surfaces of said glass substrate,
    wherein the conductive film has a thickness of 1 to 20 μm, and
    wherein said glass substrate consists of glass crystallized to have a coefficient of thermal expansion close to that of metal, whereby disconnection of the wiring layers is prevented,
    wherein an adhesion-reinforcing layer for enhancing a strength of adhesion between the glass substrate and the wiring layer, is interposed between the glass substrate and the wiring layer.

2. The printed wiring board according to claim 1, wherein the conductive film is a single conductor layer;
    wherein a protective layer is formed so as to cover at least the conductive film; and
    wherein a the protective layer is formed so as to cover only the conductive film on said inner wall surface of the through hole.

3. The printed wiring board according to claim 2, wherein the through hole is filled with the protective layer.

4. The printed wiring board according to claim 2, wherein the protective layer is a resin.

5. The printed wiring board according to claim 1, wherein the adhesion-reinforcing layer includes a layer formed by sputtering.

6. A printed wiring board comprising:
    a glass substrate having a through hole connecting opposite surfaces thereof;
    a wiring layer formed over each of the surfaces of said glass substrate; and
    a conducting portion having a conductive film formed on an inner wall surface of the through hole and providing conductor connection between the opposite surfaces of said glass substrate,
    wherein a protective layer is formed so as to cover at least the conductive film, and
    wherein said glass substrate consists of glass crystallized to have a coefficient of thermal expansion close to that of metal, whereby disconnection of the wiring layers is prevented,
    wherein an adhesion-reinforcing layer for enhancing a strength of adhesion between the glass substrate and the wiring layer, is interposed between the glass substrate and the wiring layer.

7. The printed wiring board according to claim 6, wherein the conductive film is a single conductor layer; and
    wherein a the protective layer is formed so as to cover only the conductive film on said inner wall surface of the through hole.

8. The printed wiring board according to claim 6, wherein the through hole is filled with the protective layer.

9. The printed wiring board according to claim 6, wherein the protective layer is a resin.

10. The printed wiring board according to claim 6, wherein the adhesion-reinforcing layer includes a layer formed by sputtering.

* * * * *